US011655377B2

(12) United States Patent
Chanda et al.

(10) Patent No.: US 11,655,377 B2
(45) Date of Patent: May 23, 2023

(54) INORGANIC PAINT PIGMENT WITH PLASMONIC ALUMINUM REFLECTOR LAYERS AND RELATED METHODS

(71) Applicant: UNIVERSITY OF CENTRAL FLORIDA RESEARCH FOUNDATION, INC., Orlando, FL (US)

(72) Inventors: Debashis Chanda, Oviedo, FL (US); Daniel Franklin, Orlando, FL (US); Pablo Manuel Cencillo Abad, Winter Park, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 601 days.

(21) Appl. No.: 16/707,363

(22) Filed: Dec. 9, 2019

(65) Prior Publication Data

US 2020/0181421 A1    Jun. 11, 2020

Related U.S. Application Data

(60) Provisional application No. 62/777,849, filed on Dec. 11, 2018.

(51) Int. Cl.
| | | |
|---|---|---|
| C09D 5/33 | (2006.01) |
| C23C 14/30 | (2006.01) |
| C23C 14/58 | (2006.01) |
| C09D 7/40 | (2018.01) |
| C09D 7/20 | (2018.01) |
| C09C 1/64 | (2006.01) |

(Continued)

(52) U.S. Cl.
CPC ............ C09D 5/004 (2013.01); C09C 1/642 (2013.01); C09D 7/20 (2018.01); C09D 7/70 (2018.01); C23C 14/20 (2013.01); C23C 14/30 (2013.01); C23C 14/588 (2013.01); *B01J 2/24* (2013.01)

(58) Field of Classification Search
None
See application file for complete search history.

(56) References Cited

U.S. PATENT DOCUMENTS 9,482,798 B2 *  11/2016  Lee .......................... G02B 5/26
10,371,892 B2    8/2019  Zheng et al.
(Continued)

FOREIGN PATENT DOCUMENTS

WO    WO 2005/114298 A2 *  12/2005

OTHER PUBLICATIONS

Gerard et al., Aluminum plasmonics, J. Phys. D: Appl. Phys. 48 (2015) 184001.*

(Continued)

*Primary Examiner* — Tae H Yoon
(74) *Attorney, Agent, or Firm* — Allen, Dyer, Doppelt + Gilchrist, PA

(57) ABSTRACT

An inorganic paint pigment may include a fluid matrix, and paint flakes carried within the fluid matrix. Each paint flake may include a common aluminum layer having a first major surface and a second major surface opposing the first major surface, a first plasmonic aluminum reflector layer carried by the first major surface, and a second plasmonic aluminum reflector layer carried by the second major surface.

22 Claims, 25 Drawing Sheets

(51) Int. Cl.
*C23C 14/20* (2006.01)
*B01J 2/24* (2006.01)

(56) References Cited

U.S. PATENT DOCUMENTS

| | | | |
|---|---|---|---|
| 10,442,932 B2 | 10/2019 | Duncan et al. | |
| 2004/0244649 A1* | 12/2004 | Kato | C09C 1/642 |
| | | | 106/499 |
| 2006/0262398 A1 | 11/2006 | Sangu et al. | |
| 2010/0307705 A1 | 12/2010 | Rahm et al. | |
| 2012/0224148 A1 | 9/2012 | Natsumeda et al. | |
| 2012/0262500 A1 | 10/2012 | Kitazawa et al. | |
| 2013/0182405 A1 | 7/2013 | Kaufman | |
| 2014/0085597 A1 | 3/2014 | Katou et al. | |
| 2018/0239070 A1* | 8/2018 | England | G02B 5/285 |
| 2018/0272602 A1* | 9/2018 | Rudisill | B33Y 70/00 |

OTHER PUBLICATIONS

Ye et al. Angle-insensitive plasmonic color filters with randomly distributed silver nanodisks, vol. 40, No. 21, pp. 4979-4982, Nov. 1, 2015, Optics Letters.*
Chandra et al. U.S. Appl. No. 16/710,507, filed Dec. 11, 2019.

* cited by examiner

165

INORGANIC PAINT PIGMENT WITH PLASMONIC ALUMINUM REFLECTOR LAYERS AND RELATED METHODS

GOVERNMENT RIGHTS

This invention was made with government support under grant number ECCS-1509729 awarded by National Science Foundation. The government has certain rights in the invention.

RELATED APPLICATION

This application is based upon prior filed Application No. 62/777,849 filed Dec. 11, 2018, the entire subject matter of which is incorporated herein by reference in its entirety.

TECHNICAL FIELD

The present disclosure relates to the field of nanostructure systems, and, more particularly, to self-assembled aluminum particle systems and related methods.

BACKGROUND

The science and application of nanostructured optical systems have been the focal point of growing research interest, which has been in parallel with advances in fabrication and characterization techniques. Termed colloquially as the field of plasmonics when pertaining to metals, these nanostructured materials host size-dependent resonances that alter the combined system's optical characteristics from simply that of its bulk constituents. Hence, metal nanoparticles have been the subject of thousands of research articles, regarding every aspect of their synthesis, characterization and utilization.

SUMMARY

Generally, an inorganic paint pigment may include a fluid matrix, and a plurality of paint flakes carried within the fluid matrix. Each paint flake may include a common aluminum layer having a first major surface and a second major surface opposing the first major surface, a first plasmonic aluminum reflector layer carried by the first major surface, and a second plasmonic aluminum reflector layer carried by the second major surface.

In particular, the common aluminum layer may comprise an aluminum mirror layer. Each of the first plasmonic aluminum reflector layer and the second plasmonic aluminum reflector layer may comprise an oxide layer over the common aluminum layer, and a layer of self-assembled aluminum particles over the oxide layer.

For example, the oxide layer may comprise an aluminum oxide layer. Plasmon resonance within each of the first plasmonic aluminum reflector layer and the second plasmonic aluminum reflector layer may be independent to an angle of incidence for incident visible radiation.

Also, the fluid matrix may comprise at least one of a solution and a polymer resin. The fluid matrix may comprise a binder fluid. The fluid matrix may comprise isopropyl alcohol (IPA). Each paint flake may be symmetric about the common aluminum layer.

Another aspect is directed to a method for making an inorganic paint pigment. The method may comprise forming a plasmonic aluminum reflector stack on a sacrificial polymer layer, and dissolving the sacrificial polymer layer and generating a plurality of paint flakes from the plasmonic aluminum reflector stack. Each paint flake may include a common aluminum layer having a first major surface and a second major surface opposing the first major surface, a first plasmonic aluminum reflector layer carried by the first major surface, and a second plasmonic aluminum reflector layer carried by the second major surface, and placing the plurality of paint flakes into a fluid matrix.

DETAILED DESCRIPTION

Figure 1:
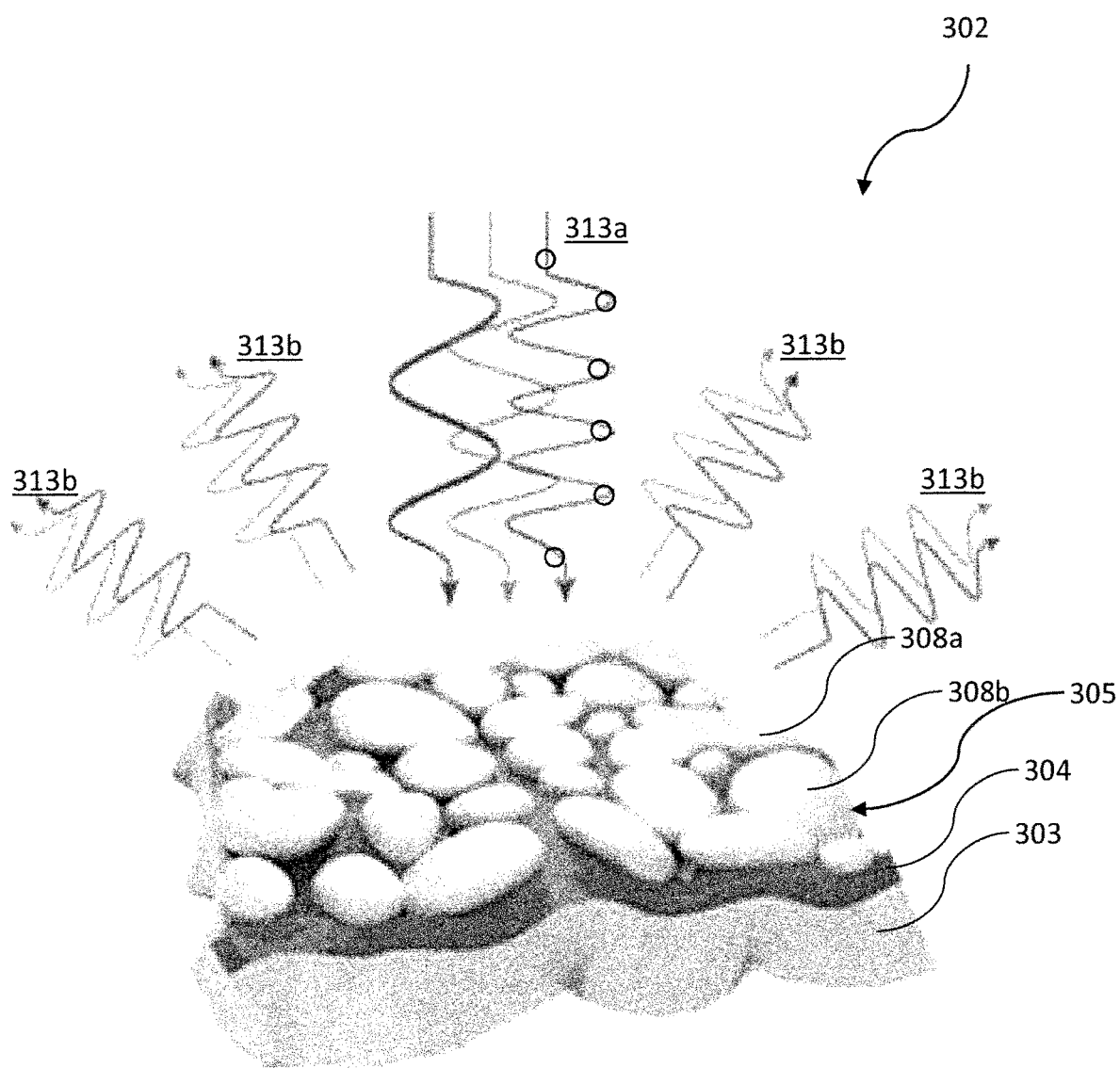
FIG. 1 is a schematic diagram of self-assembled aluminum particles on an oxide spacer and aluminum mirror layer, according to the present invention.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

The application of plasmonic color to surfaces is a more recent development enabled by the vacuum deposition of metallic films. The first demonstrations originate from the early 20th century, but widespread use required advances in vacuum technology not present until the 1930's. The evaporated films were vital to the production of high quality mirrors and industry-need fueled research to improve their optical properties. Detailed studies of the metallic films and the influence of deposition conditions continued throughout the 1950's till today. These included fundamental research on the correlation of nano-topography and optical properties, along with explanations of various thin-film growth modes. These early studies clearly show the existence of plasmonic resonances in arrays of particles formed through vacuum evaporation, and the ability to tune this resonance through the morphology of the surface, indirectly controlled through process parameters.

Advances in fabrication and simulation techniques have further expanded our understanding of these particle arrays. By placing particles near a mirror, interference has been found to enhance the plasmonic resonances of the particles. However, many of these examples use distances of 50 nm or more between the resonating particles and mirror. This reliance on Fabry-Perot induced resonances creates an inherent undesired angle dependence in the resulting systems. Those that have demonstrated angle-insensitive resonances are limited by expensive fabrication methods or unsaturated color. If placed within 10s of nanometers, however, oscillations in electron density interact with their image charge and produce hybrid resonance states. This strong near-field coupling provides a route to angle-independent resonances and another degree-of-freedom with which to control and tune the optical properties of the surface. However, examples of this phenomenon rely on highly dispersed arrays of particles spin-cast from chemically derived dispersions. This results in highly non-uniform and unsaturated surfaces. On the other hand, de-wetting, another well-known technique, has recently found its application in color generation.

Different subtractive colors can be achieved by controlling the initial thickness of the metal film and then post annealing. However, this method requires high temperatures close to the melting point of the metal. This also puts constraints on the materials used and examples have resulted in limited color saturation or even broadband absorption leading to black surfaces. Laser-assisted methods have also attracted a lot of attention. By either reshaping particles through localized dewetting or particle creation through ablation, these methods can produce microscopic color images highly angle independent due to the particles deep-subwavelength size. However, the color quality shown in these examples is still lacking for many potential applications due to the lack of control of particle size distributions and density.

In the present disclosure, a large area, highly reproducible self-assembling technique where aluminum particles are formed on a surface through a temperature and pressure dependent thin film growth mechanism in an ultra-high vacuum electron beam evaporator is disclosed. The narrow, sub 10 nm gaps between particles and the mirror, hybridize individual plasmonic modes and manifests a single angle-insensitive resonance with near 100% absorption. This process is compatible with and takes on the scattering properties of underlying arbitrary substrates and can result in completely diffusive, angle-independent and flexible plasmonic color surfaces. The present disclosure demonstrates several key advantages compared to previous demonstrations—advantages that when combined, open the door to many applications and potential markets for plasmonic nanostructures.

Self-Assembled Aluminum Plasmonic Surface

The plasmonic system comprises of a dense array of aluminum nanoparticles formed on top of an oxide coated aluminum backplane, an illustration of which is shown in FIG. 1. Ambient white light excites resonances within the structure, which are predominantly confined to the gaps between particles. These resonances demonstrate a high degree of angle-independence and their spectral location is a function of the size distribution of the aluminum particles, the surrounding refractive index and the optical distance from each other and the mirror. Light, which is not absorbed by the surface, is reflected to result in a perceived color. The fundamental physics of this gap-plasmon mode is discussed in the sections below.

The particles form through a temperature and pressure dependent thin film growth mechanism in an ultra-high vacuum electron beam evaporator, and understanding this growth mechanism is vital in designing and controlling attributes of the surface. Island formation in thin film growth has been extensively studied and is generally separated into three modes: Frank-van der Merwe (Layer-by-Layer), Volmer-Weber (Island), and Stranski-Krastanov (Layer and Island). Aluminum exhibits the Volmer-Weber growth mode, which is initiated by the adsorption of atoms to the surface of the substrate. The energetic molecule is free to diffuse along the surface until it settles on a site with a local energy minimum.

Subsequent aluminum atoms adsorb, diffuse and condense about these low energy sites in a process termed nucleation. As this continues, particles anchored at adjacent nucleation sites touch and form grain boundaries, or if energetically favorable, coalesce to form larger particles. The shape of the combined particles depends on the equilibrium condition between the aluminum's free energy and interfacial stress with the substrate. The accumulative result of this process at three deposition thicknesses (4 nm, diagram 150a; 7.5 nm, diagram 150b; and 11 nm, diagram 150c;) can be seen in FIGS. 2A-2C, resulting in yellow, magenta, and cyan sample colors, respectively. Scanning electron micrographs (SEMs) of the samples show an increase in particle size as a function of material deposited. Insets depict microscope camera images taken from the respective surfaces. Interestingly, the fill fraction of particles on the surface remains near unity for all samples which indicates a high number of nucleation sites in the initial phase of deposition. From the SEM images, FIG. 3 includes a diagram 151 of histograms of particle size using the Gwyddion software package and approximate the area of each particle with an equivalent circular area. The distributions shown in FIG. 3 indicate that the spread of particle diameters increases within a sample as deposition continues. This is also seen qualitatively from the SEM images that the rather circular particles of the yellow sample become more irregular as lateral particle size increases. This is attributed to the interfacial energy of aluminum to the aluminum oxide substrate at odds with the aluminum particle surface energy, preventing the aluminum from reforming into symmetric oblate ellipsoids. Despite this increasing irregularity, the particle distributions are isotropic and show no preferred particle elongation direction.

The island formation is a statistical process which greatly depends on the temperature of the substrate and pressure of the chamber at the time of evaporation. In the present disclosure, it is shown that surfaces deposited below 100° C. and above $10^{-7}$ Torr result in colored surfaces, however, are relatively unsaturated. Alternatively, the color vibrancy appears to increase with the lower pressure and the hotter the substrate. These differences are the result of changes in contact angle between the aluminum particles and that of the aluminum oxide spacer, therefore modifying the plasmonic resonance strength and coupling efficiency.

The thickness of this oxide layer influences the coupling and overall strength of the resonance while having little impact on resonance location. This is optimized over this parameter, and it was found that a thickness of 10 nm results in the most pronounced resonances and therefore vivid color. If desired, however, this parameter can be used as an independent mechanism by which to achieve any color less saturated than and within the color gamut of the optimized nanostructure.

Color Space and Origin of Plasmonic Color

Figure 4A:
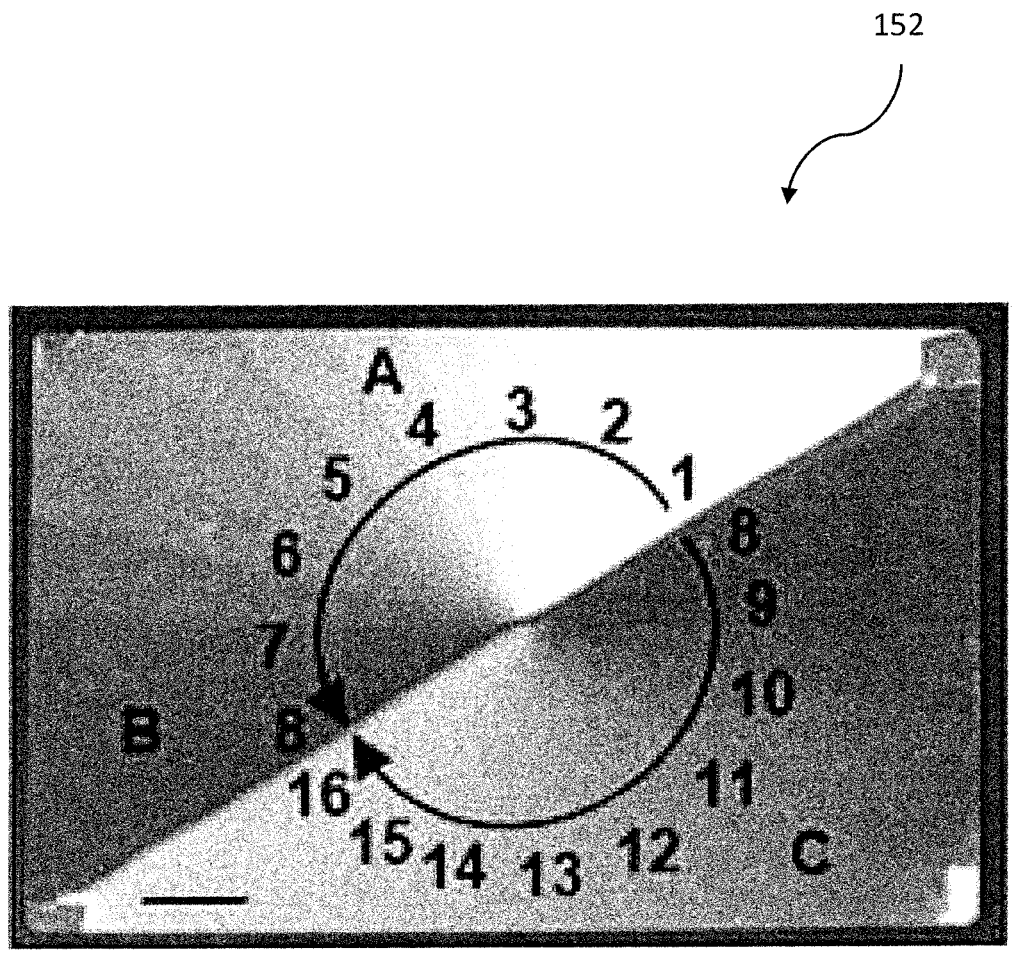
FIG. 4A is an image of a sample in which the amount of aluminum deposited is azimuthally varied, according to the present invention.
Figure 4B:
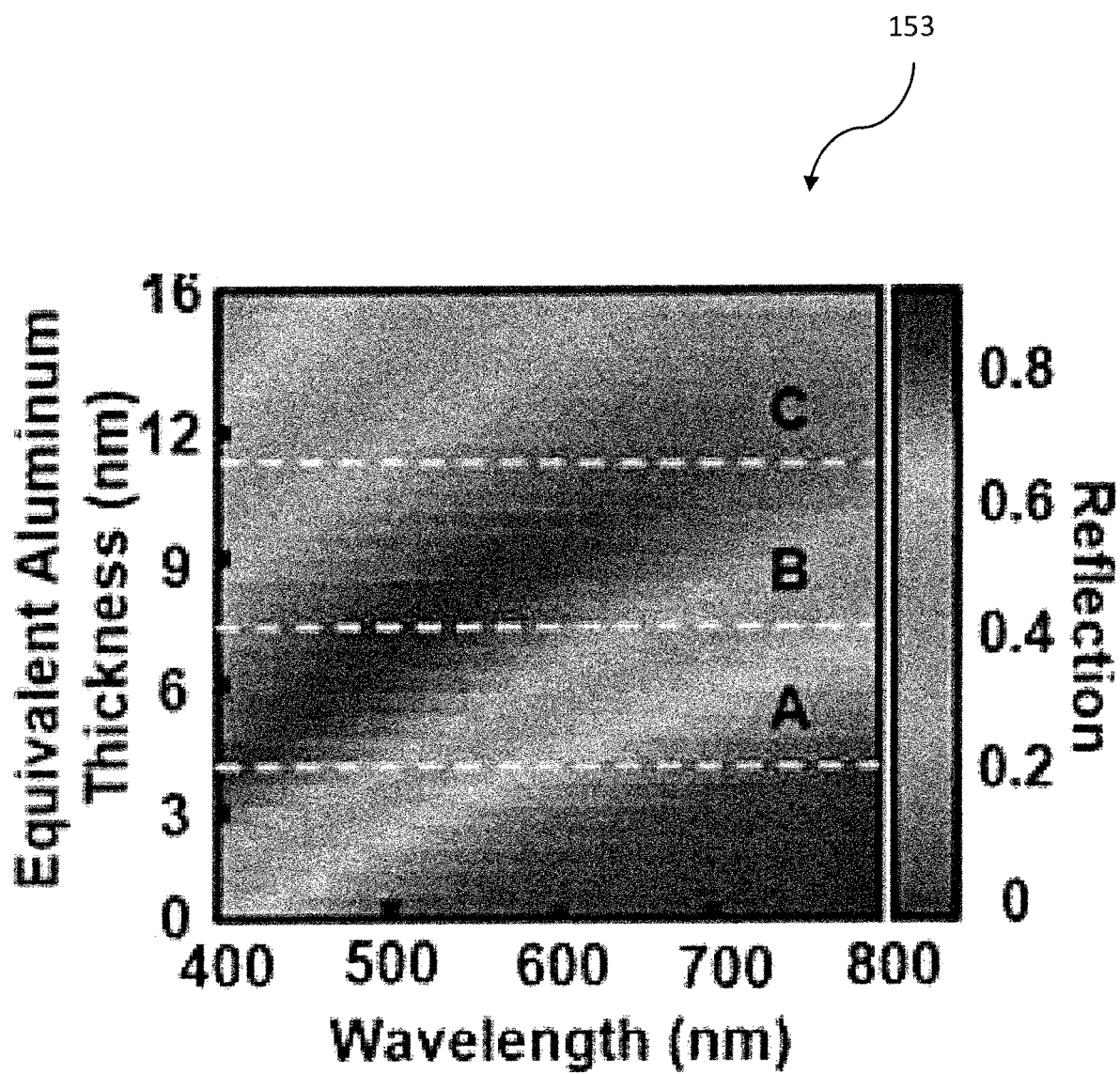
FIG. 4B is a diagram of the reflectance spectra of the sample shown in FIG. 4A.
Figure 4C:
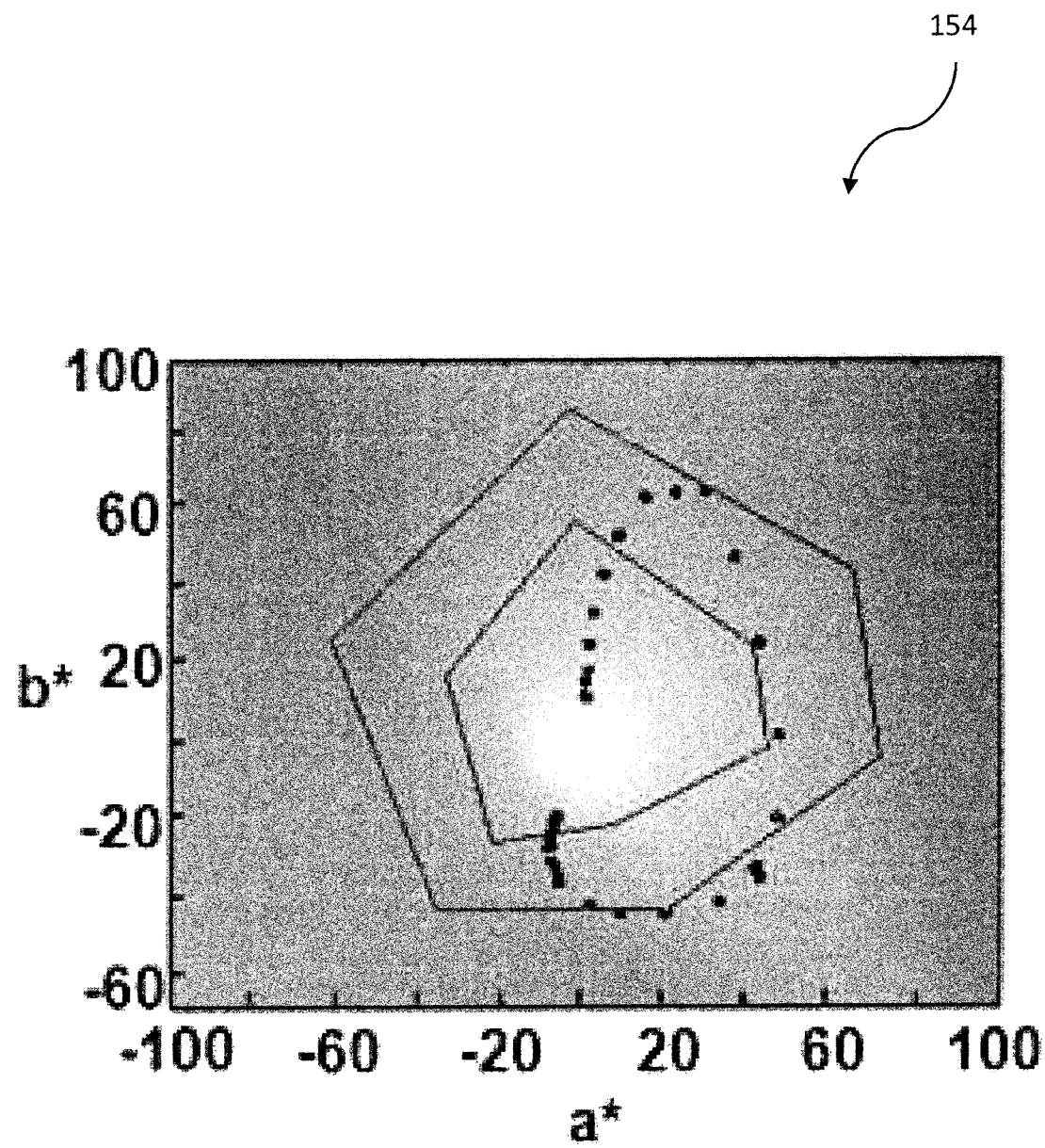
FIG. 4C is a diagram of a CIE Lab space diagram, according to the present invention.

To show the range of color achievable with such a system, the present disclosure includes a sweep over the thickness of aluminum deposited by adapting a partial shutter and rotatable stage. The sample is rotated roughly 11° every 0.5 nm for 8 nm, and then a step of statically depositing another 8 nm. This method results in the vivid sample and corresponding spectra shown in diagrams 152, 153 of FIGS. 4A-4B. As the deposition begins, the white mirror-like reflectance of the sample turns yellow as the plasmonic resonance redshifts from the UV to visible spectrum. The pronounced, near 100% absorption resonance continues to shift through the visible regime, creating a standard subtractive color palette. The dashed white lines of FIG. 4B correspond to the yellow (A), magenta (B) and cyan (C) samples of FIG. 4A, and the SEM images of FIGS. 2A-2C. The color quality or contrast of the reflective colors are quantified in a diagram 154 of FIG. 4C as represented in the CIE Lab color space.

The more vivid a color, the further it is from the origin—while near the center resides unsaturated mixtures of light culminating in the white point. Black dots on the graph represent the color of the plasmonic surface and are obtained by applying the standard CIE chromaticity function conversion to the spectra of FIG. 4B. To provide context to this color quality, an overlay of two color quality standards is used in the commercial printing industry—ISO 12647-3 for the inner hexagon representing newsprint and SWOP Coated 1, ISO-standard on Grade 1 high quality photo paper for the outer hexagon in FIG. 4C. The color generated by the plasmonic surface exceeds a fair portion of the newsprint color space and reaches that of the high-quality photo paper for certain colors. However, the singular subtractive resonance of the surface prohibits the creation of green and color mixing techniques must be employed—just as in conventional Cyan Magenta Yellow Black (CYMK) (i.e. CYMK color model) printing. This limitation is addressed and proposed methods to achieve green and expand the color space are disclosed within sections below.

Figure 4D:
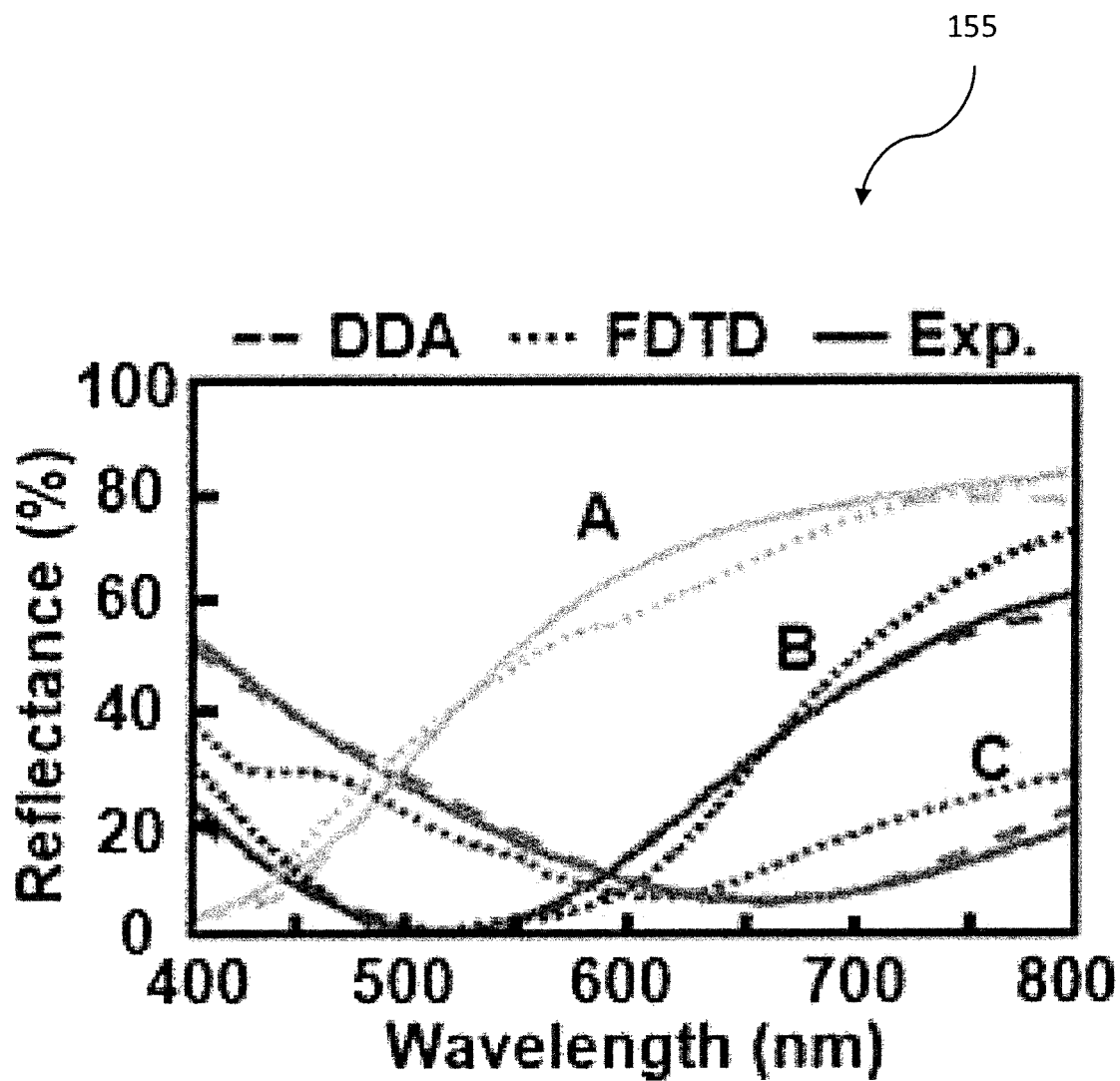
FIG. 4D is a diagram of spectrometer measurements of the surface compared to discrete dipole approximation theory and finite difference time domain modeling, according to the present invention.

To understand the fundamental resonance mechanisms involved in the particle system, the present disclosure employ a series of analytical modeling techniques and compares throughout with experimental and FDTD simulated reflection spectra of the three selected particle distributions, yellow (A), magenta (B) and cyan (C), shown in a diagram 155 of FIG. 4D. Due to the highly dense and subwavelength nature of the particle films, the first analytical approach is a stratified effective medium theory (EMT) where an effective polarizability is obtained for the particle film assuming the fundamental shape of oblate ellipsoids. Size distributions and depolarization terms are included to account for the inhomogeneous linewidth broadening and particle-to-particle near field coupling, respectively. Once this singular layer is approximated, Fresnel equations are then applied to find the total reflectance coming from the combined particle film, oxide spacer and mirror system.

Alternative models which account for truncated spheroids, near field interactions at material interfaces and higher order multipolar resonances can all be implemented, but each hosts their own assumptions and limitations on particle shape, coverage and surrounding media, etc. The present disclosure finds the EMT model employed here adequately fits that of the experimental spectra with the use of a single fitting parameter that approximates the accumulative depolarization of particles imparted by particle-particle and particle-mirror near field coupling—the latter of which is not captured by the application of Fresnel equations in the thin spacer-oxide limit.

Figure 2A:
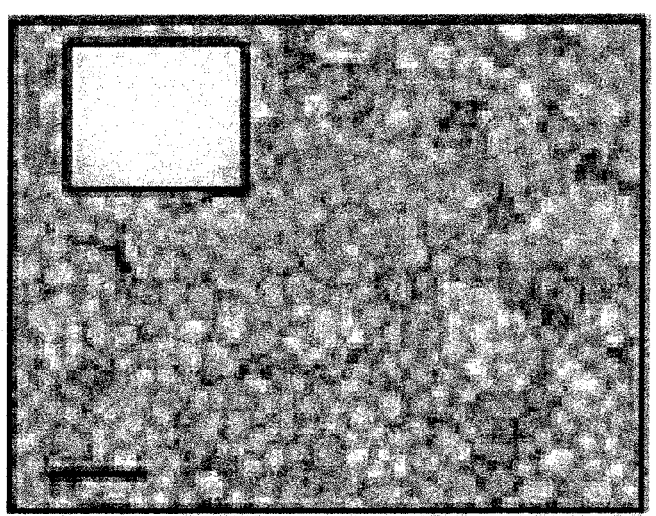
FIGS. 2A-2C is a set of scanning electron microscope images of three sampled surfaces corresponding to yellow, magenta, and cyan, respectively, according to the present invention.
Figure 2B:
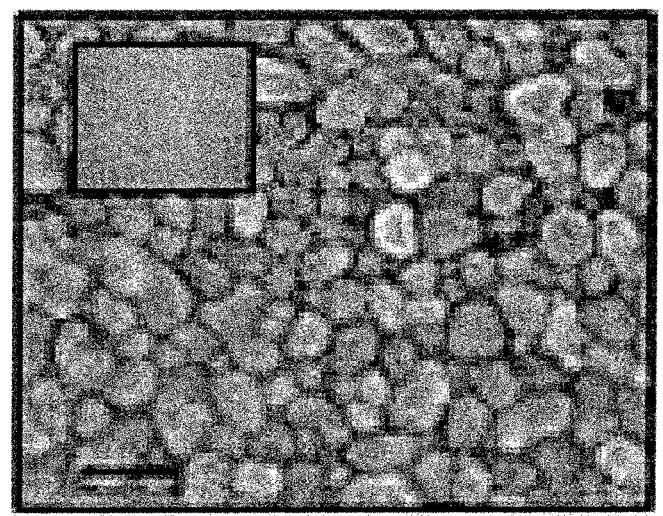
Figure 2C:
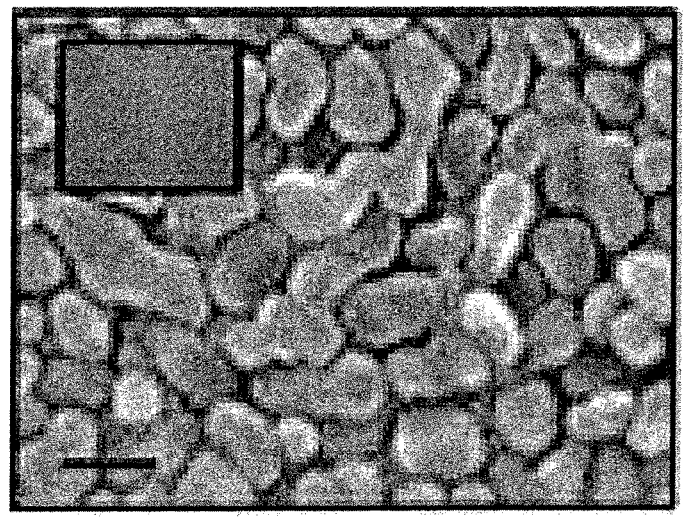
Figure 3:
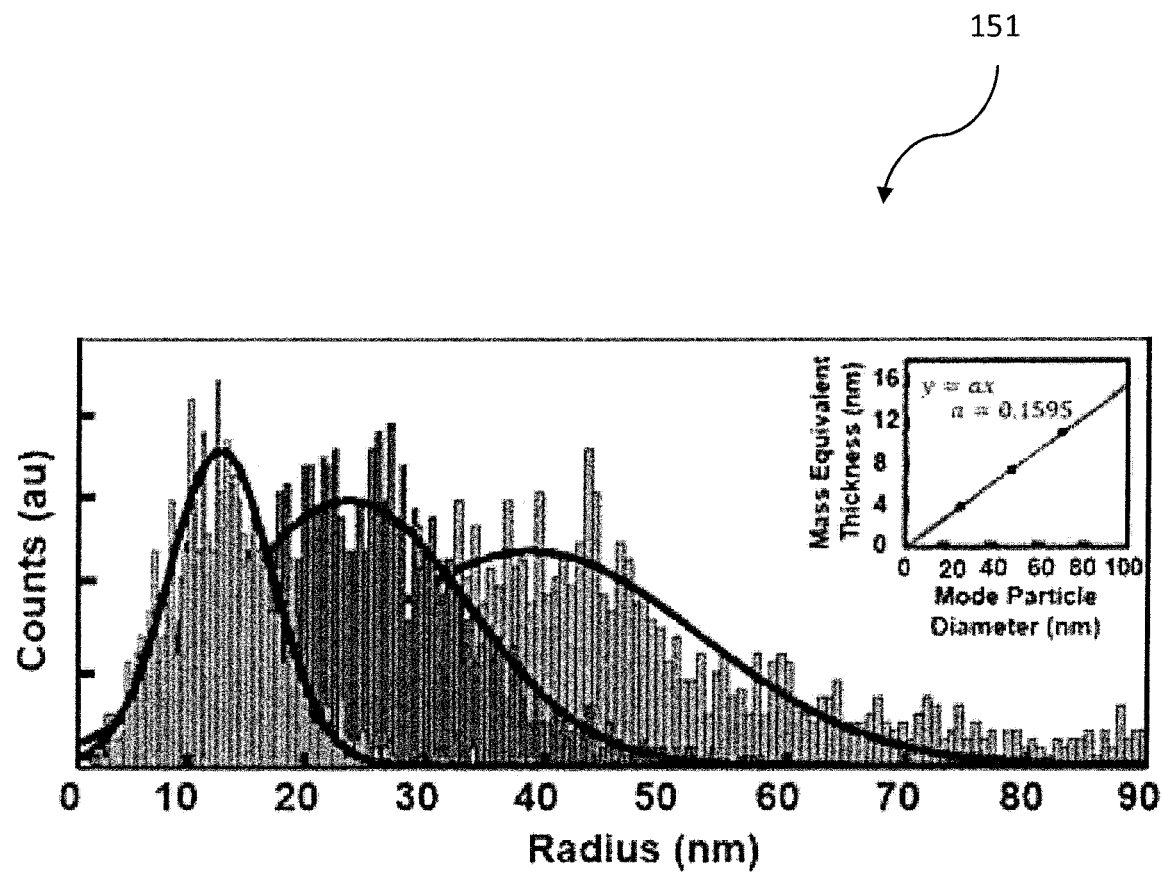
FIG. 3 is a histogram of particle sizes obtained from the SEM images shown in FIGS. 2A-2C.

To further validate the EMT method and visually identify resonance mechanisms, the present disclosure directly applies finite-difference-time-domain modeling to the SEM images of FIGS. 2A-2C. This brute force approach—of importing particle surfaces and extrapolating into large simulation volumes—accounts for particle distributions, near-field coupling effects and gives a unique perspective on field localization within a randomly distributed particle media. Reflectance spectra are shown in FIG. 4D and compared to the experiment and the EMT model. While the spectra are close, the SEM images only give an accurate x-y profile of the particle shape and location. The present disclosure approximates the out-of-plane profile as a cropped oblate ellipsoid and attribute this as one source of spectral differences. Many particles are also required to accurately represent the dispersion of particles and the broad resonances they create.

Figure 4E:
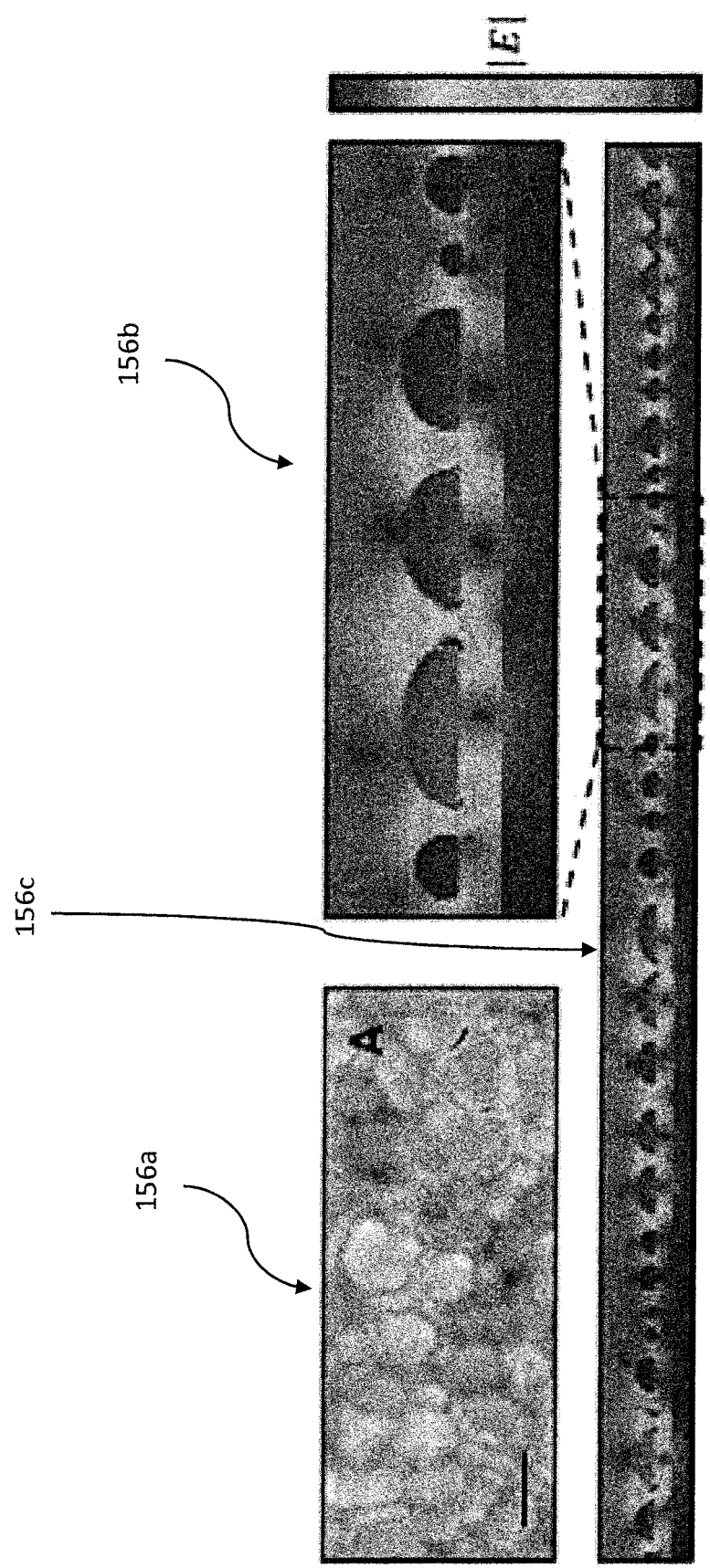
FIG. 4E is a diagram of field profiles obtained through finite-difference-time-domain (FDTD) at resonance showing field confinement in the gaps between particles, according to the present invention.

Here, the present disclosure uses surfaces with 1372, 1659, and 1539 particles in C, B, and A, respectively —equivalently a total surface area of 10.76 µm², 2.983 µm² and 0.662 pmt. Diagrams 156a-156c in FIG. 4E shows an example of the fields generated through such simulations for the A surface in the x-y plane as well as the x-z plane at the resonant wavelength of 400 nm. From these, it can be seen that the fields are highly confined to the edges of the particles and within particle-particle and particle-mirror gaps. Further results of the full-wave simulations for A, B, and C—including decompositions of fields—are provided in SI units FIGS. 4A-4C. The fields surrounding the particles are characteristic of gap surface plasmons but occur at wavelengths not predicted in previous reports. To elucidate the relation of the dense particle system with that of gap surface plasmons, the present disclosure modifies an alternative model which first determines the dispersion of a metal-insulator-metal (MIM) waveguide. The following relation is commonly used:

$$\tanh\left(\frac{\sqrt{\beta^2 - k_0^2 \varepsilon_d} t_d}{2}\right) = \frac{-\varepsilon_d \sqrt{\beta^2 - k_0^2 \varepsilon_m}}{\varepsilon_m \sqrt{\beta^2 - k_0^2 \varepsilon_d}}$$

where, $\beta$ is the propagating wave, $t_d$ is the thickness of the insulator, $\varepsilon_d$ and $\varepsilon_m$ are the dielectric constants of the insulator and metal, respectively.

This equation assumes two infinite metal regions surrounding a dielectric gap of finite thickness. The particles and thin films used in MIM resonators, however, cannot be approximated as infinite if their thickness is comparable to their skin-depth. The present disclosure performs finite element method simulations (Mode Solutions, Lumerical) to quantify the impact of this approximation on the effective index of a mode propagating parallel to the surface, within the dielectric gap, as a function of top metal thickness, $d_2$.

Figure 4F:
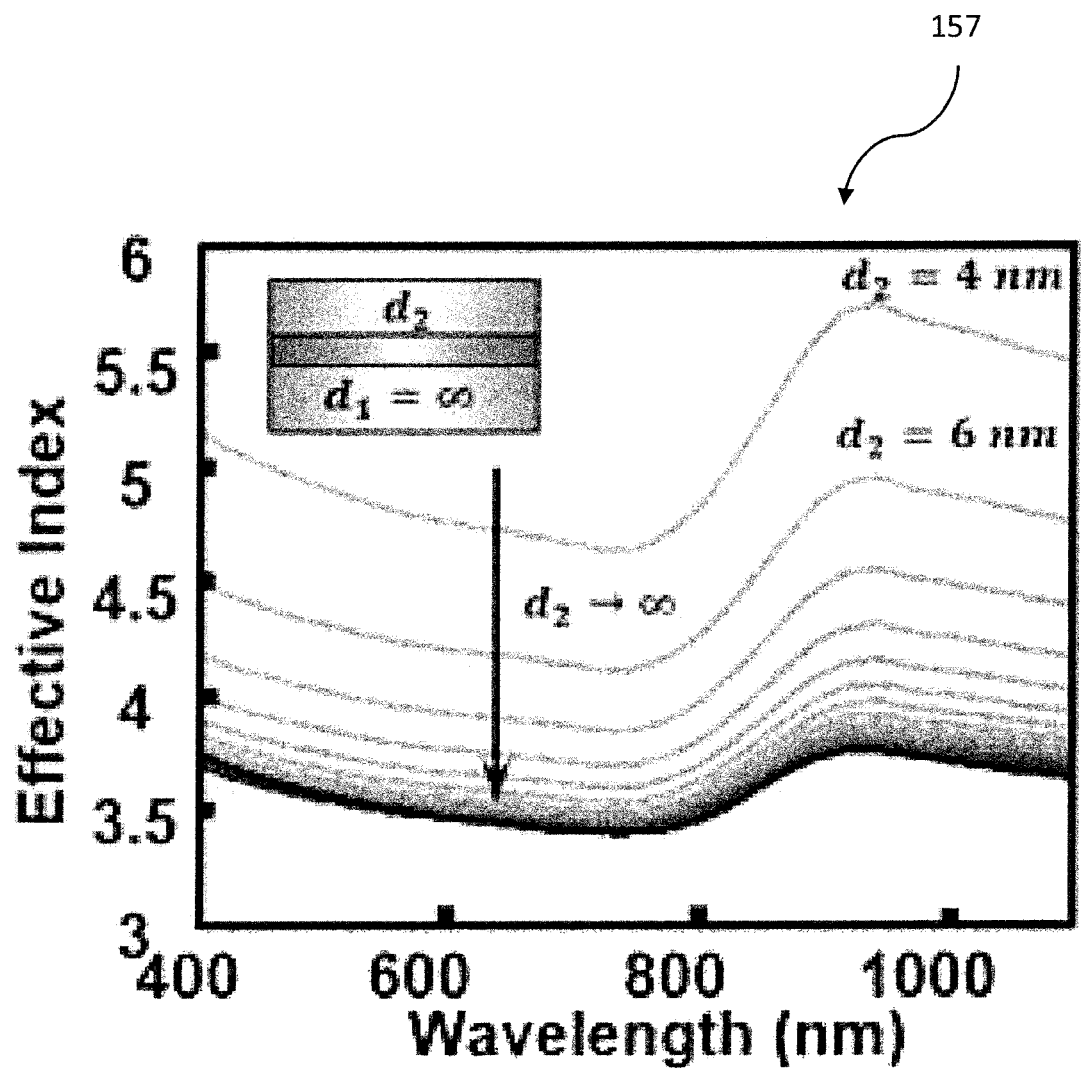
FIG. 4F is a diagram of finite element method modeling of a metal-insulator-metal system as a function of top metal thickness, according to the present invention.

Here, aluminum is used as the metal and 10 nm of aluminum oxide used as the spacer. The thickness, $d_1$, of the bottom metal is 300 nm—well beyond the skin-depth of the material and can therefore be safely approximated as infinite within the visible domain. Diagram 157 of FIG. 4F shows the results of these simulations and that the index of the mode varies greatly for top film thicknesses less than 20 nm. As the film thickness increases, the index approaches that of the infinite case and closely matches that obtained analytically, represented by the black line. Once the effective index is attained as a function of film thickness, the condition for constructive interference for such a propagating mode is applied:

$$W\left(\frac{2\pi}{\lambda_{res}}\right) n_{eff} = m\pi - \phi,$$

where W is the diameter of the top film, $n_{eff}$ the effective index of the propagating mode, m the mode order and $\phi$ a phase term due to reflection at the particle boundary.

Figure 4G:
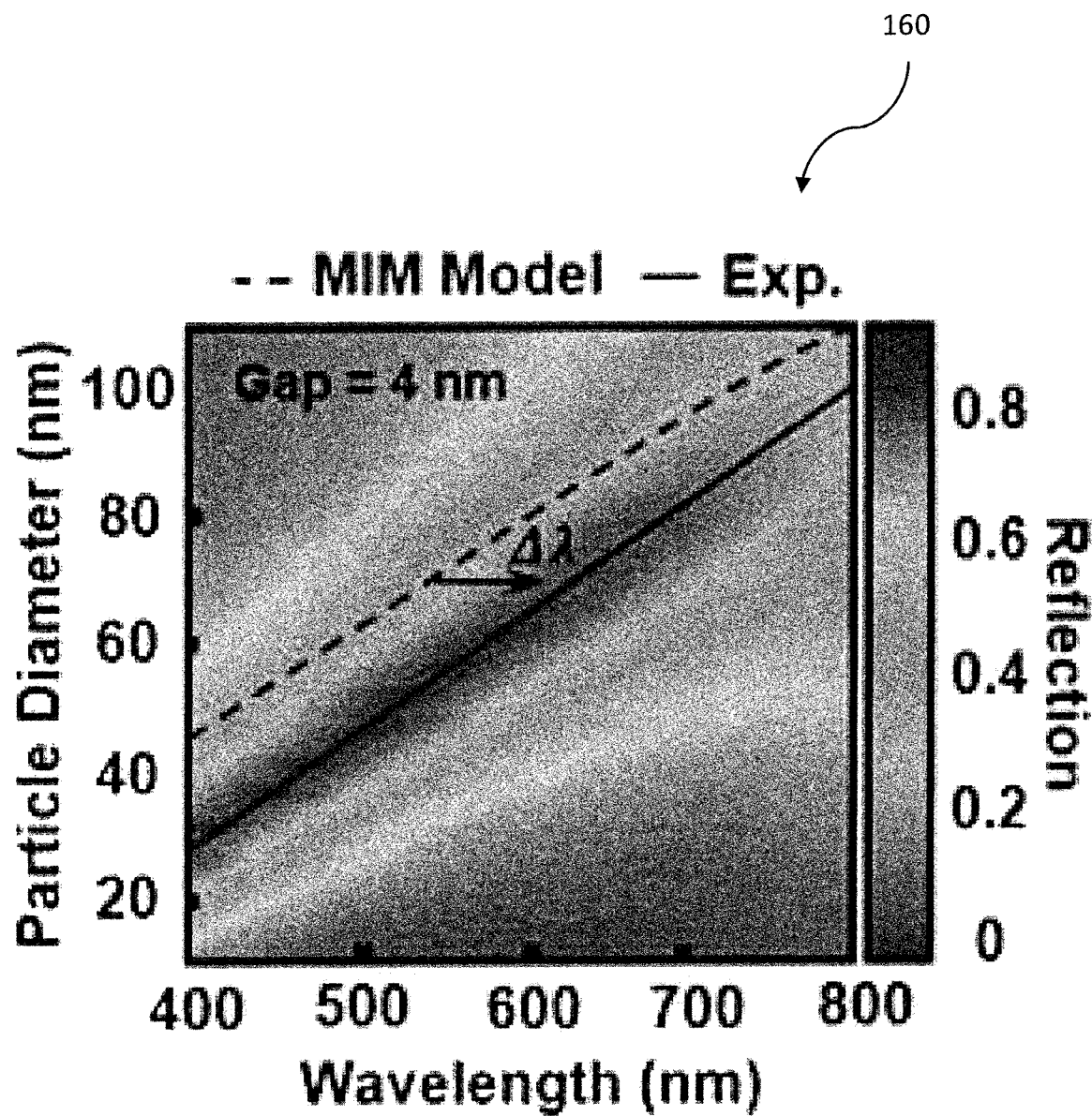
FIG. 4G is a diagram of FDTD simulations predicting resonance location as a function of particle diameter, according to the present invention.

Using the first order (m=1) and assuming zero reflective phase, the combination of these relations allows us to predict the resonant wavelength, $\lambda_{res}$, for a given particle diameter. Due to the close packing nature of the particle arrays, the present disclosure approximates the particle height as the equivalent mass thickness of the deposited film and relate this to particle diameter through the particle distributions of FIG. 3. The results of this approach are represented by the dashed black line in a diagram 160 of FIG. 4G and can be compared to the red dashed line of the infinite metal MIM case and the solid black line of experiment, which are overlaid atop a sweep of FDTD simulations which perform as a control.

In these simulations, a single particle is assumed within square periodic boundary conditions. This simplification of the surface as a perfectly ordered square array neglects the impact of size distributions but allows to isolate the impacts of various physical parameters and greatly reduces simulation requirements. Using an inter-particle gap of 4 nm, which is obtained through SEM images, the location of the plasmonic resonance red-shifts linearly with particle diameter—a result in close agreement with the experimental spectra shown in FIG. 4B. The resonances also have a narrower full-width-half-maximum than experimental results due to the lack of inhomogeneous broadening originating through the approximations outlined above. The results show a discrepancy with the predicted resonance location obtained through the analytical and hybrid MIM models and are shifted by a wavelength of $\Delta\lambda$=90 nm.

The MIM model neglects the near-field coupling that occurs between particles and the hybridization of plasmonic modes that results. This hybridization can be understood as the splitting of energy levels within the system into parallel and anti-parallel resonances on adjacent particles. The in-phase resonance becomes a blue-shifted non-radiative mode whereas the out-of-phase resonance red-shifts and can be excited via external light. The strength of this splitting and, therefore, amplitude of the red or blue shift depends greatly on the inter-particle distance and has been termed the plasmonic ruler effect in previous literature.

This idea stems from classical electromagnetic theory, where the interaction energy between two radiating dipoles is given by:

$$U = \frac{1}{4\pi\varepsilon_0} \frac{|\mu|^2}{n_m^2 S^3} \kappa,$$

where $|\mu|^2$ is the squared modulus of the transition dipole moment, $n_m$ is the refractive index of the surrounding medium, S is the dipole-dipole separation and the orientation factor $\kappa = \cos \alpha_{12} - 3 \cos \alpha_{1S} \cos \alpha_{2S}$, where $\alpha_{12}$, $\alpha_{12}$, and $\alpha_{12}$ represent the angles between the two dipoles and the vector connecting them.

Figure 4H:
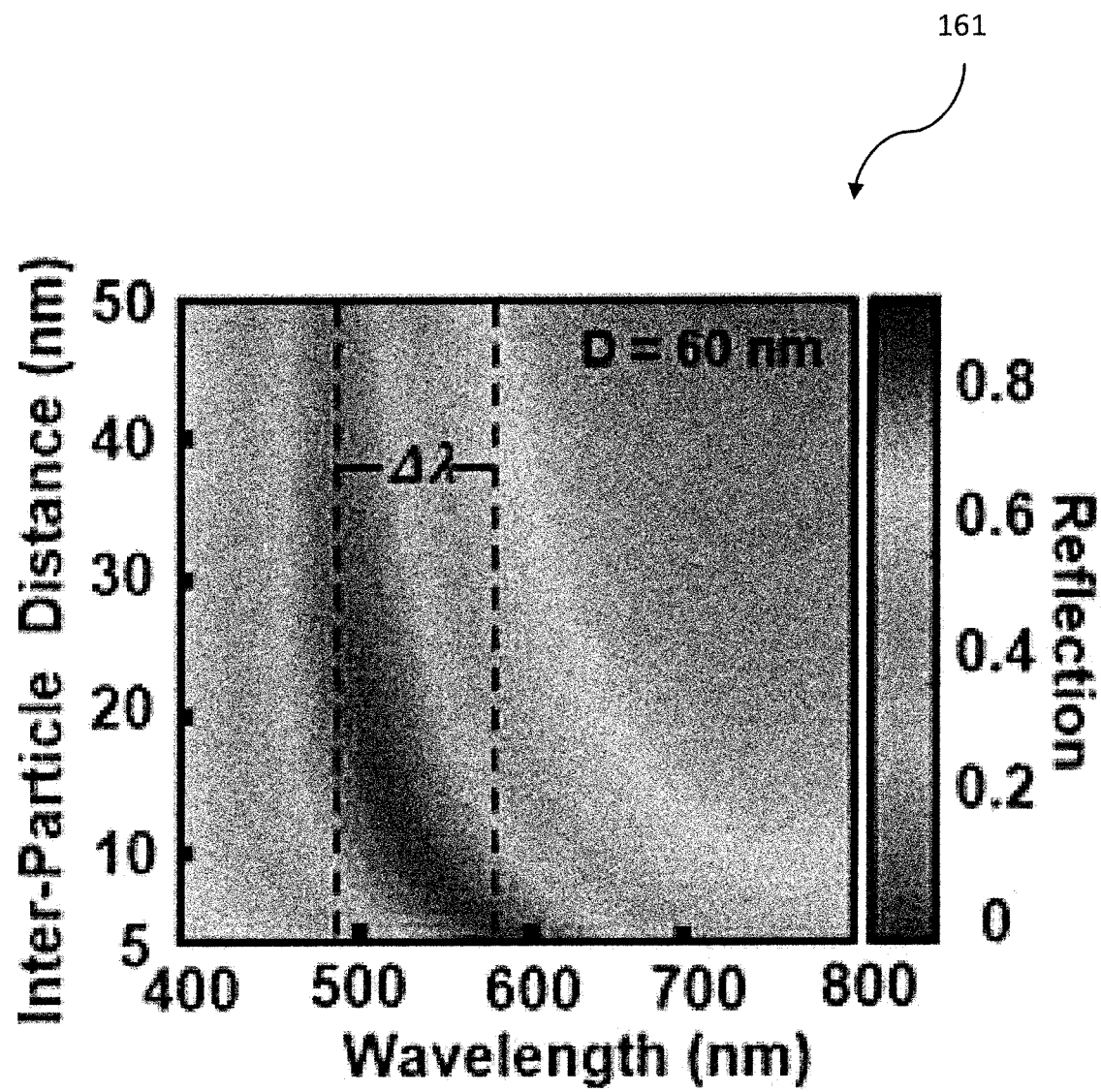
FIG. 4H is a diagram of FDTD simulations over interparticle distance in which the shift in resonance location from model and experiment is found to be the near-field coupling of adjacent particles, according to the present invention.

FIG. 4H includes a diagram 161, which shows a series of FDTD simulations by changing this inter-particle distance while keeping a constant particle diameter. As the inter-particle distance increases, it is observed that the characteristic $$\frac{1}{r^3}$$

decay in interaction energy and blue-shift of the resonance wavelength. This value asymptotically approaches that of the infinitely spaced particle case, but which becomes negligible beyond 40 nm. The resonance shift, $\Delta\lambda$, from the infinite inter-particle distance case to the experimentally obtained distance of 4 nm closely matches that obtained through FIG. 4G and confirms that the near-field coupling plays a pivotal role in defining the resonance location and ultimately color of the plasmonic surfaces. Through the models and simulations above, the present disclosure shows how the system can be understood through different lenses and theoretical starting points. Whether beginning with the optical properties of a single particle, extending to an effective optical film and then the effects of mirror coupling, or beginning with a combined mirror-insulator-mirror system, obtaining resonance relations through constructive interference conditions, and then accounting for hybridization due to the close packed nature of the film, the present disclosure's results show that they are consistent and equivalent.

Angle Dependence of Plasmonic System

In the pursuit of high contrast color, some approaches compromise and sacrifice various other attributes of the system. A common approach is the adoption of grating coupled or Fabry-Perot based nanostructure modes. While these can produce narrow and high amplitude reflectance, the color observed is inherently dependent on the angle of incident light. For consumer product coloration, this is unacceptable and has inhibited such structural color from practical implementation.

Figure 5:
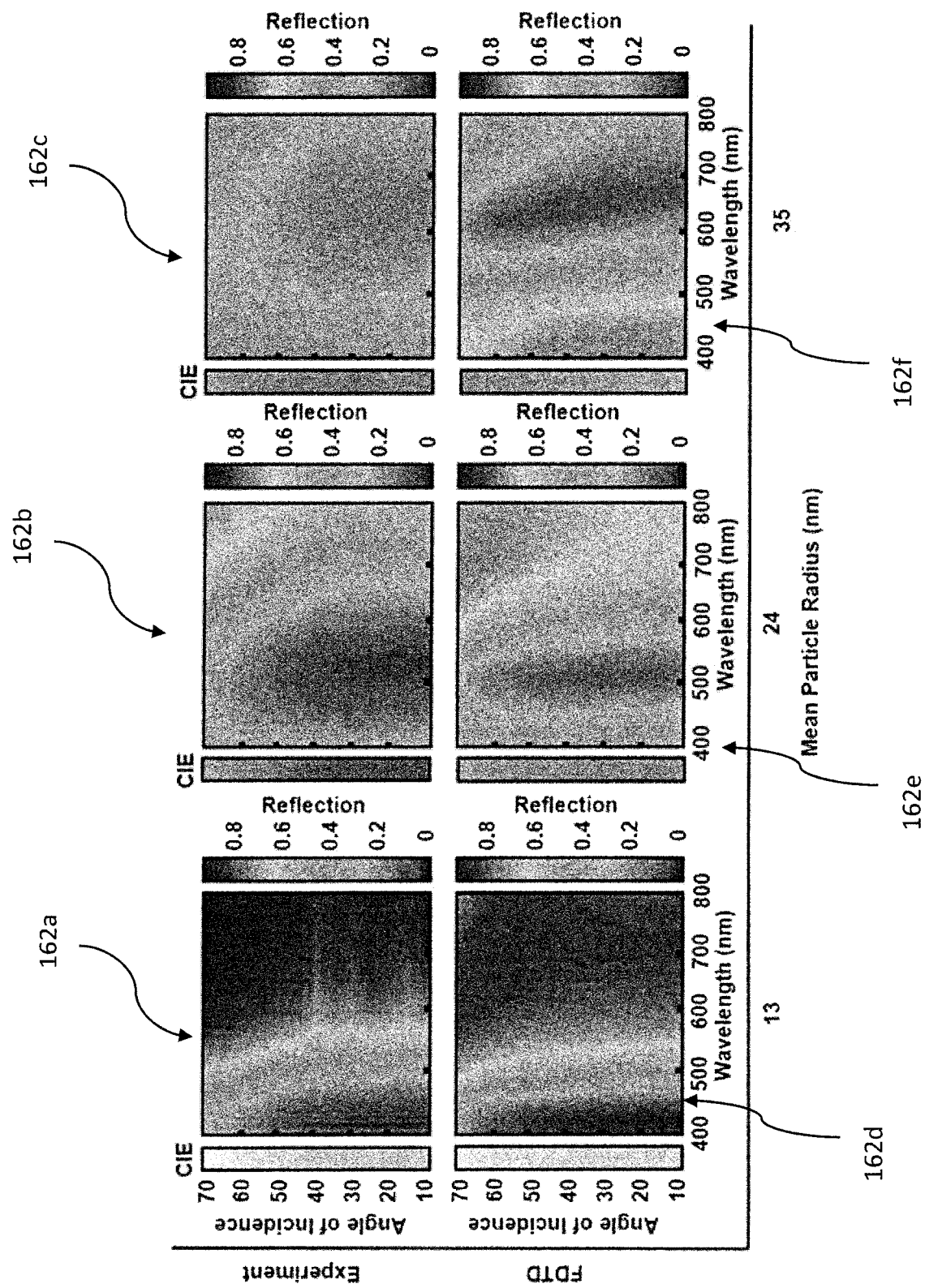
FIG. 5 is a diagram of angle independent plasmonic color where the top experimental row is obtained through angle resolved reflectance measurements using an integrating sphere and fiber optic coupled spectrometer, and where the bottom row consists of FDTD simulations using assuming a perfectly periodic square array of particles, according to the present invention.

The present disclosure demonstrates a key advantage of the subwavelength localized gap plasmon resonance of the aluminum island nanostructure and address the need for high contrast color in addition to angle insensitivity. Utilizing a reflective integrating sphere with a rotatable mount (RTC-060-SF, as available from Labsphere, Inc. of North Sutton, N.H.) and a spectrometer (HR 2000+, as available from Ocean Optics, Inc. of Largo, Fla.), the spectra of the three selected samples (yellow (A), magenta (B), and cyan (C)) are shown in diagram 162a-162f of FIG. 5. These measurements verify the invariance of the aluminum island plasmonic system to excitation angle. To test the validity of these results, the present disclosure also includes FDTD simulation sweeps over incident angle for three equivalent particle radii; 13 nm, 24 nm and 39 nm, respectively. These radii are obtained by the mean of the particle distributions of FIGS. 2A-2C. Again, the present disclosure approximates the particle system as a perfectly periodic square array to perform the large number of required simulations and accepts that the resulting resonances will be narrower than the experimental case as discussed above. Comparing these results, the resonance locations closely match, as well as the qualitative behavior of the resonance as a function of angle. To determine the impact of angle on the color perceived from the surface, the present disclosure present the CIE predicted color adjacent to each data set—further confirming the large angle invariance of the surface.

Diffuse and Flexible Plasmonic Color

Figure 6A:
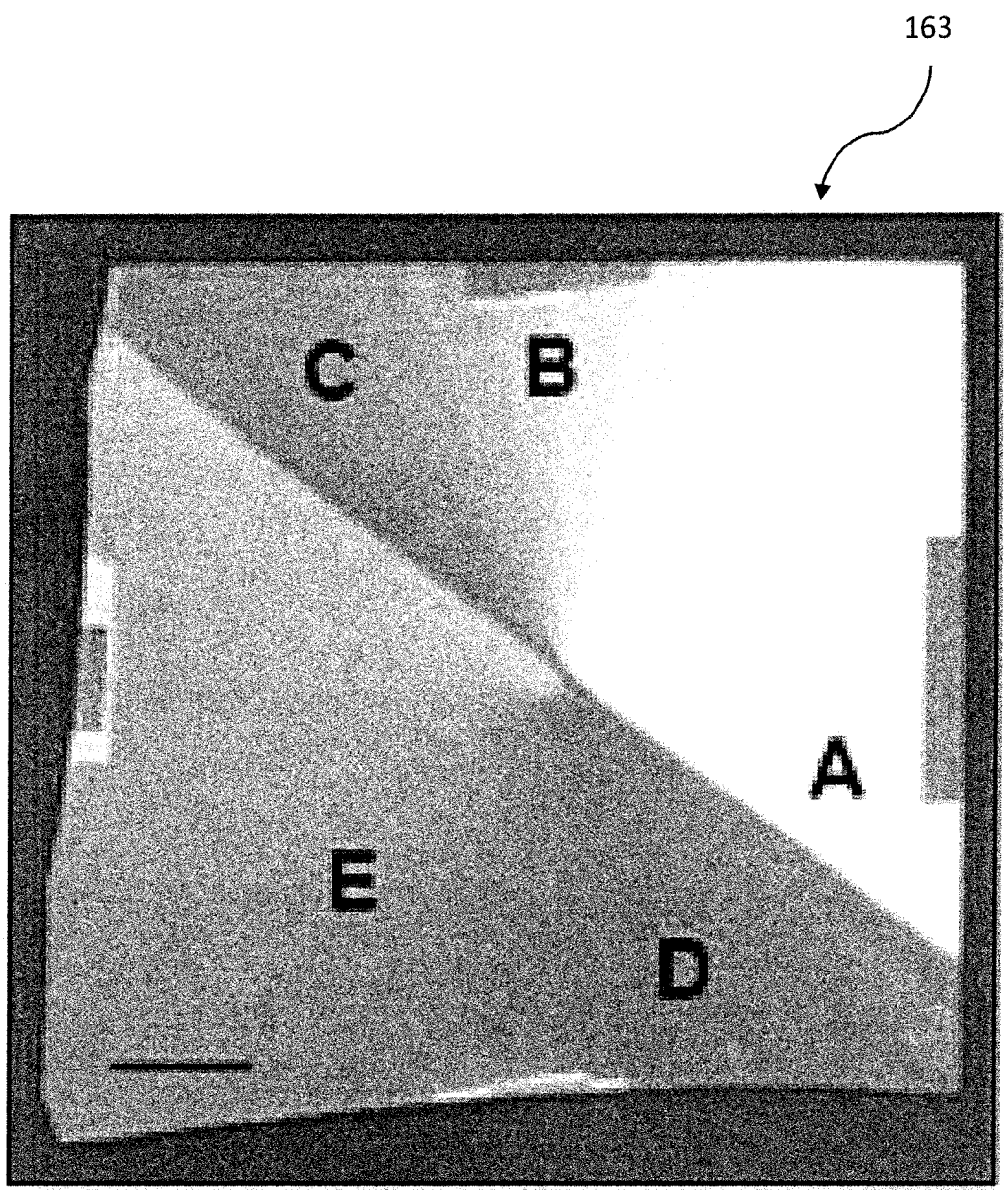
FIG. 6A is an image of the plasmonic system formed on a piece of sandblasted glass which results in a near Lambertian diffuse reflectance, according to the present invention.
Figure 6B:
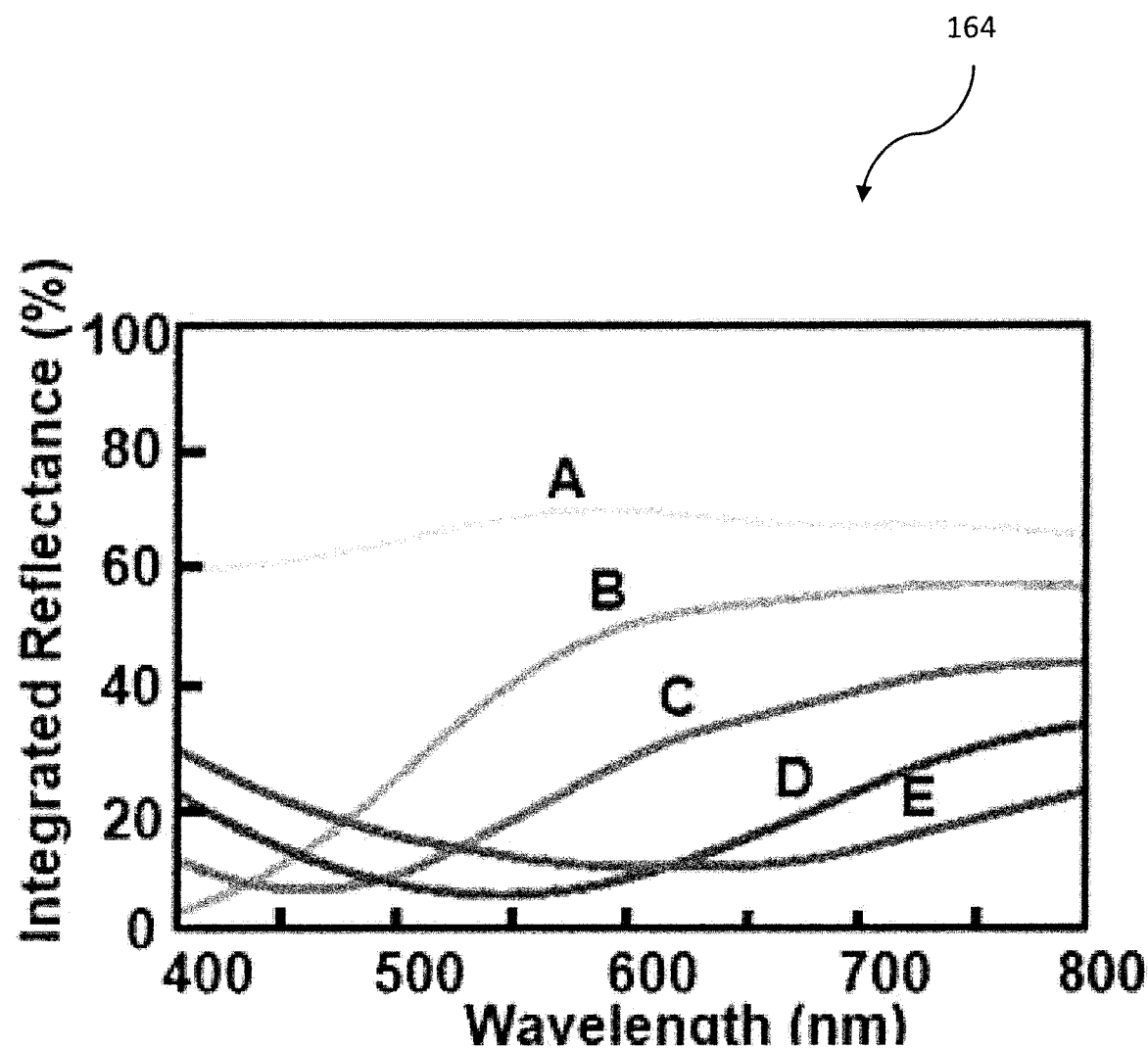
FIG. 6B is a diagram of experimentally obtained integrated reflectance from the sample in FIG. 6A.

One of the defining advantages of the aluminum island system is its ability to be formed on arbitrary surfaces. This fabrication flexibility allows the system to take on the scattering attributes of the substrate and leads to the first-time demonstration of potential diffuse plasmonic color. In an image 163 of FIG. 6A, the present disclosure demonstrates this ability by forming the plasmonic surface on sandblasted glass. The surface of the glass is jagged and contains random microstructures more than 100 µm in height. The result is an extremely diffuse, mat and paper-like finish compared to the specular mirror-finish when created on optically smooths surfaces. To quantify the diffusiveness of the surface, the present disclosure includes integrating sphere measurements with the incident beam normal to the sample. Specular reflection from the surface exits the sphere and only scattered light is measured and shown in a diagram 164 of FIG. 6B. Normalized with respect to a Spectraflect coated surface (98% near-Lambertian surface, Labsphere), much of the light is scattered but while maintaining the color of the underlying nanostructure. However, it was also observed that a slight broadening of the spectra, which is attributed to the extreme angles, more than 70°, at which a portion of particles will be excited.

Figure 6C:
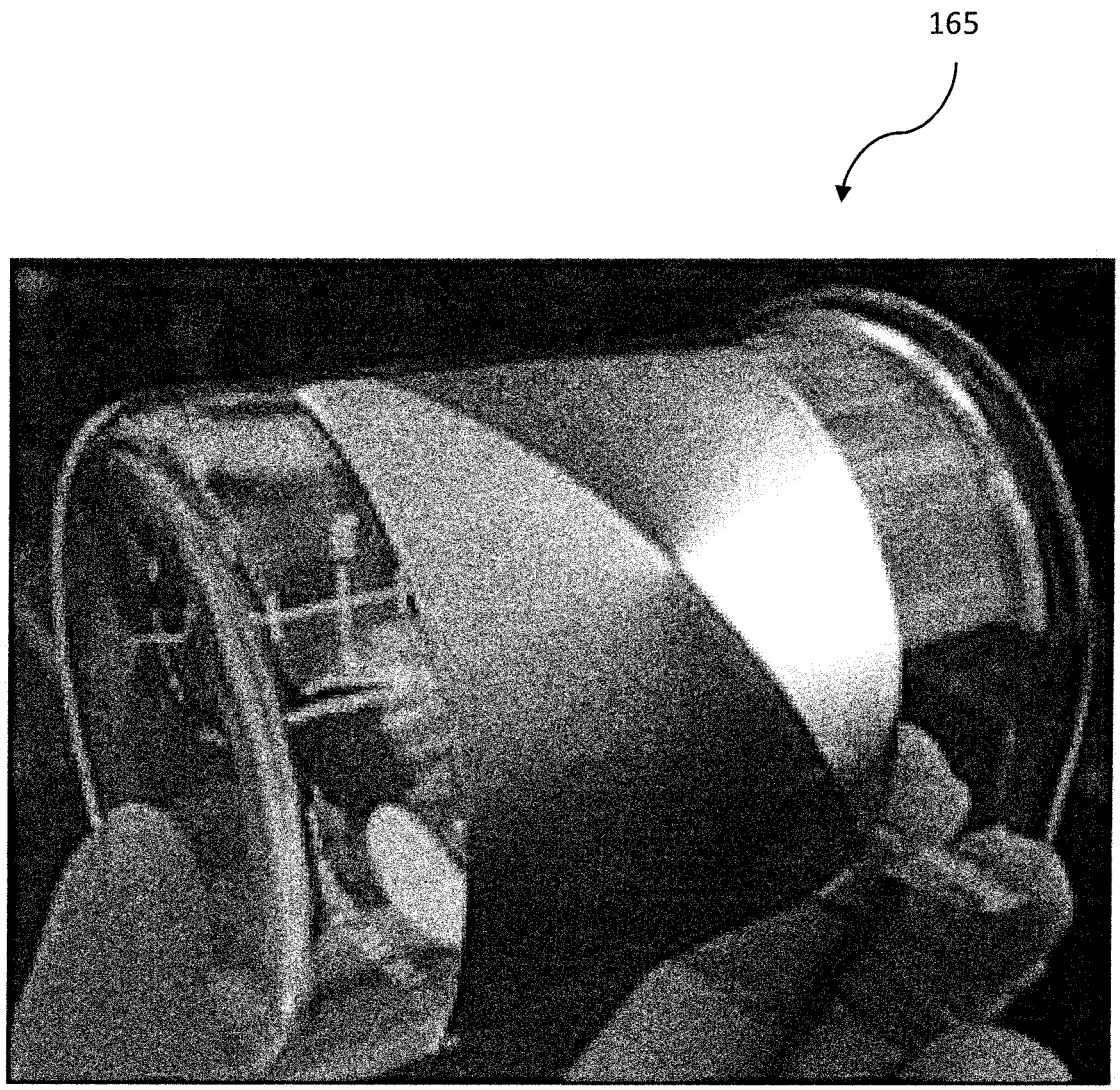
FIG. 6C is an image of a fabrication performed on a thin, flexible layer of polydimethylsiloxane (PDMS), according to the present invention.

Another advantage of the fabrication process is the low temperatures at which samples are formed. This is in contrast to the annealing techniques commonly employed to generate similar particle films. Image 165 of FIG. 6C shows the color space of the plasmonic system fabricated on a flexible PDMS substrate and attached to a curved surface. Interestingly, the deposition of a thick aluminum mirror on the PDMS creates micro corrugations on the surface which results in a shimmering semi-diffuse effect on the reflected color.

Figure 6D:
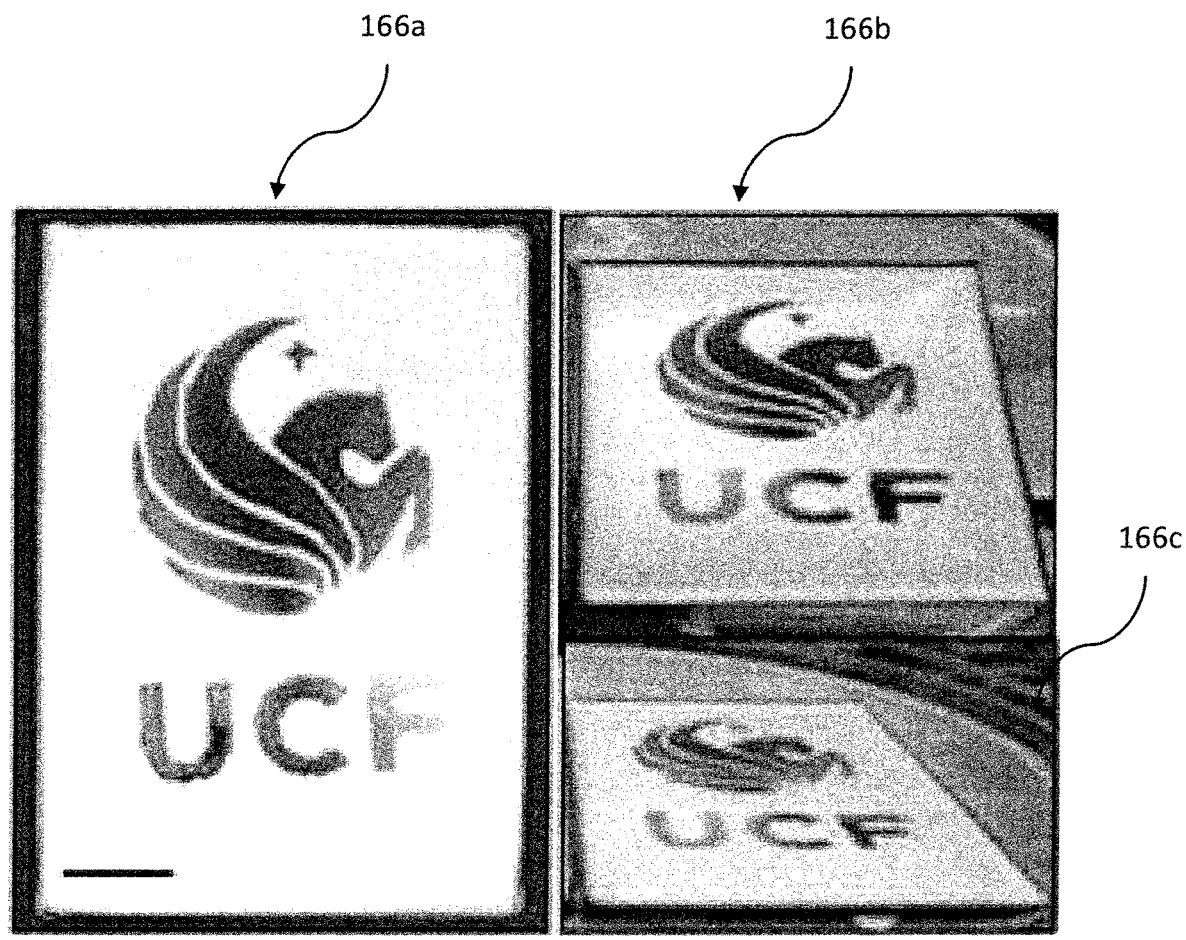
FIG. 6D is an image of masked fabrication of the aluminum particles, according to the present invention.

This potentially opens opportunities to a large range of consumer products and further research including dynamic stretchable tunability and integration with biomedical devices. Stencils or conventional lift-off techniques can also be employed to pattern the plasmonic surface and by placing a physical mask on the substrate before a rotated particle deposition, the present disclosure recreates the "UCF" Pegasus logo. The images 166a-166c of FIG. 6D are taken at increasing angles to reaffirm the system's angular invariance.

Figure 6E:
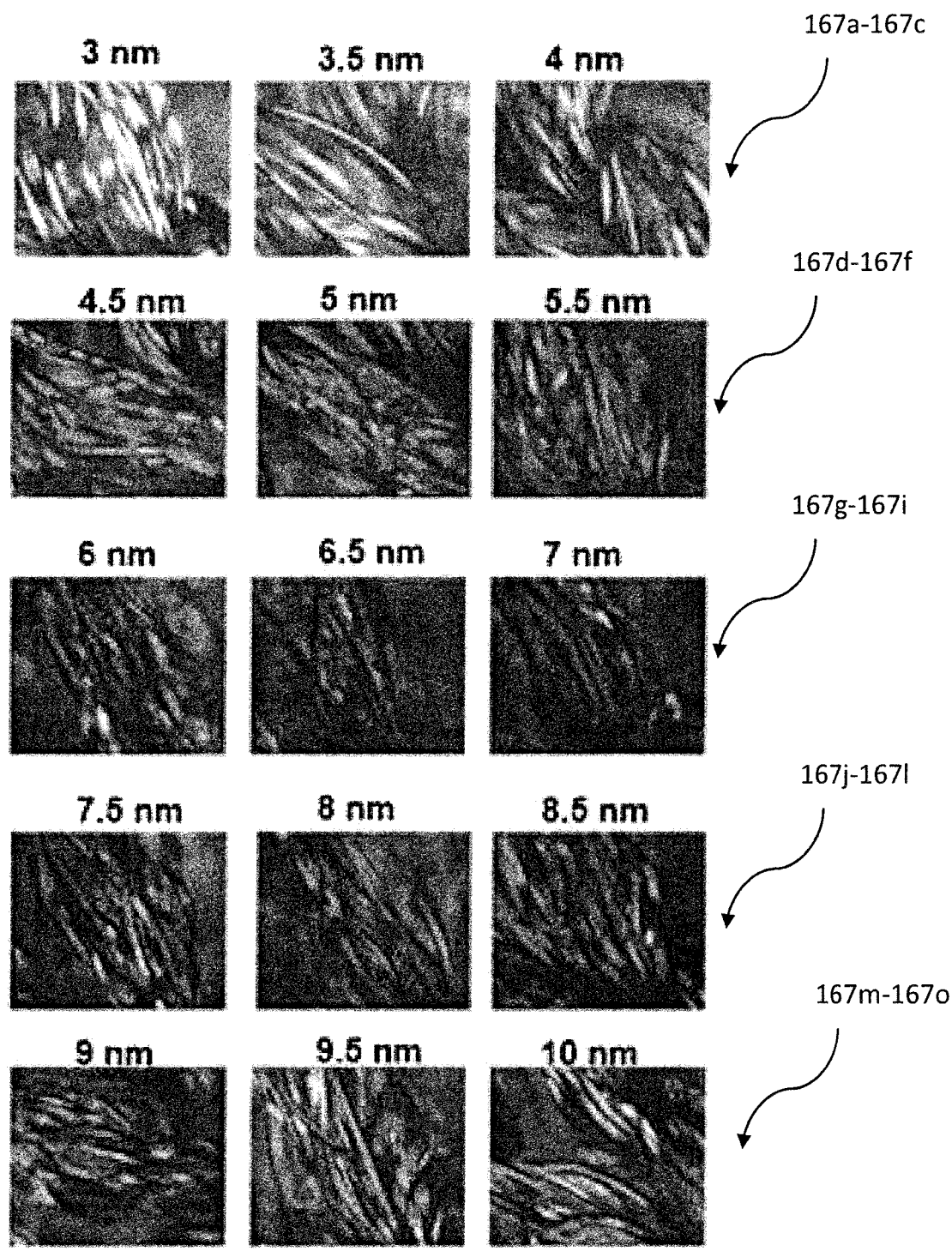
FIG. 6E is a set of microscope images of the surface fabricated on a PET fabric, according to the present invention.

The present disclosure shows the ability to form the plasmonic system on fibers and fabrics. Microscope camera images 167a-167o of the surface at 15× magnification are presented in FIG. 6E, spanning the same subtractive color gamut produced on alternative substrates. Due to the anisotropic nature of electron beam evaporation, only a portion of the fibers are coated with the plasmonic surface, which can lead to poor angle performance in certain types of fabrics. However, it is believed that implementation of angled depositions along with stage rotation could greatly reduce these effects. The summation of these advantageous attributes makes the plasmonic particle system a promising candidate for new multifunctional materials with stretchable, flexible, angle-independent and diffuse color properties which could find use in display and biosensing applications.

Color Space Expansion

The present disclosure demonstrates a relatively large CYMK color gamut (CYMK in conjunction with LC) compared to other non-diffractive plasmonic color schemes, but this can be further improved through an exploration of aluminum thin film growth mechanisms. While a deep resonance may be a requirement, the ideal width of the resonance is substantial (full width at half maximum (FWHM)≈75 nm) and changes based on the resonance's location. This is due to the subtractive nature of the color as opposed to the additive color of light generating systems like LEDs. While a sharp peak in the spectra might be desired for additive color, a narrow and deep absorption dip would still result in an unsaturated color close to the white point for subtractive color. For this reason, independent control over the resonance location and width would be highly desirable. The present disclosure has shown that the resonance location depends directly on the mean particle size which is controlled through the amount of material deposited. The width of the resonance, however, depends on several factors from the geometry of the system to the dispersion of the underlying plasmonic material.

The most straightforward is the inhomogeneous resonance linewidth broadening due to variations in particle size and shape. Above, it has been seen that as more material is deposited and islands begin to coalesce, the distribution of particle size increases. The reflectance spectrum of a distribution of particles can be understood as the geometrical mean of the spectra arising from its individual components. Therefore, templated self-assembled methods which exhibit order may allow control over the distribution of particles and limit the dispersion of size as particles coalesce as a function of deposition parameters. Alternatively, modifications to the formation process of the particles through higher growth temperatures, alloys, applied voltage or barrier oxides can be explored to increase surface tension and allow coalescing particles to more uniformly reform.

Figure 7A:
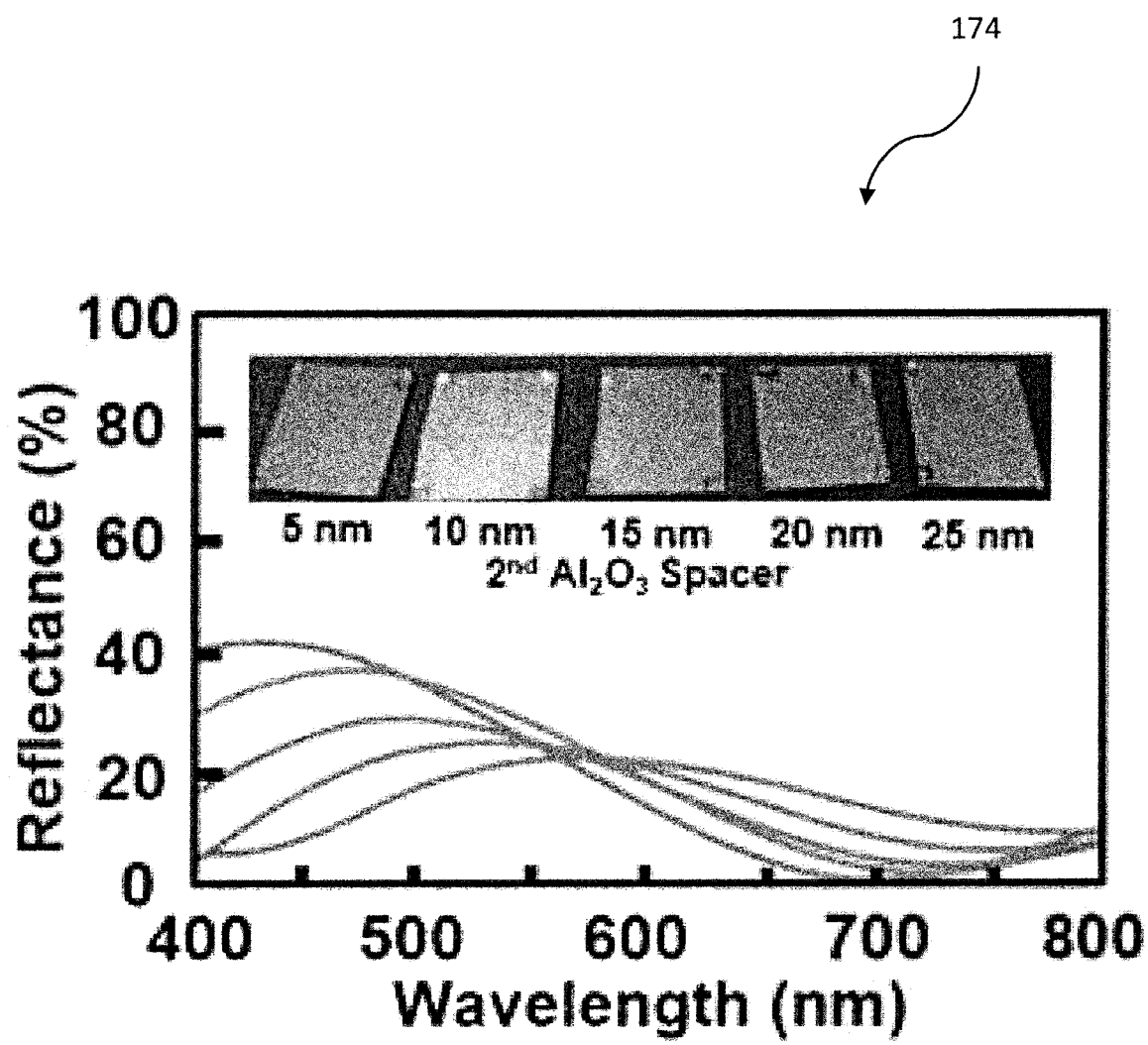
FIG. 7A is a diagram of the effect of the second oxide spacing layer on the reflectance of the surface, according to the present invention.
Figure 7B:
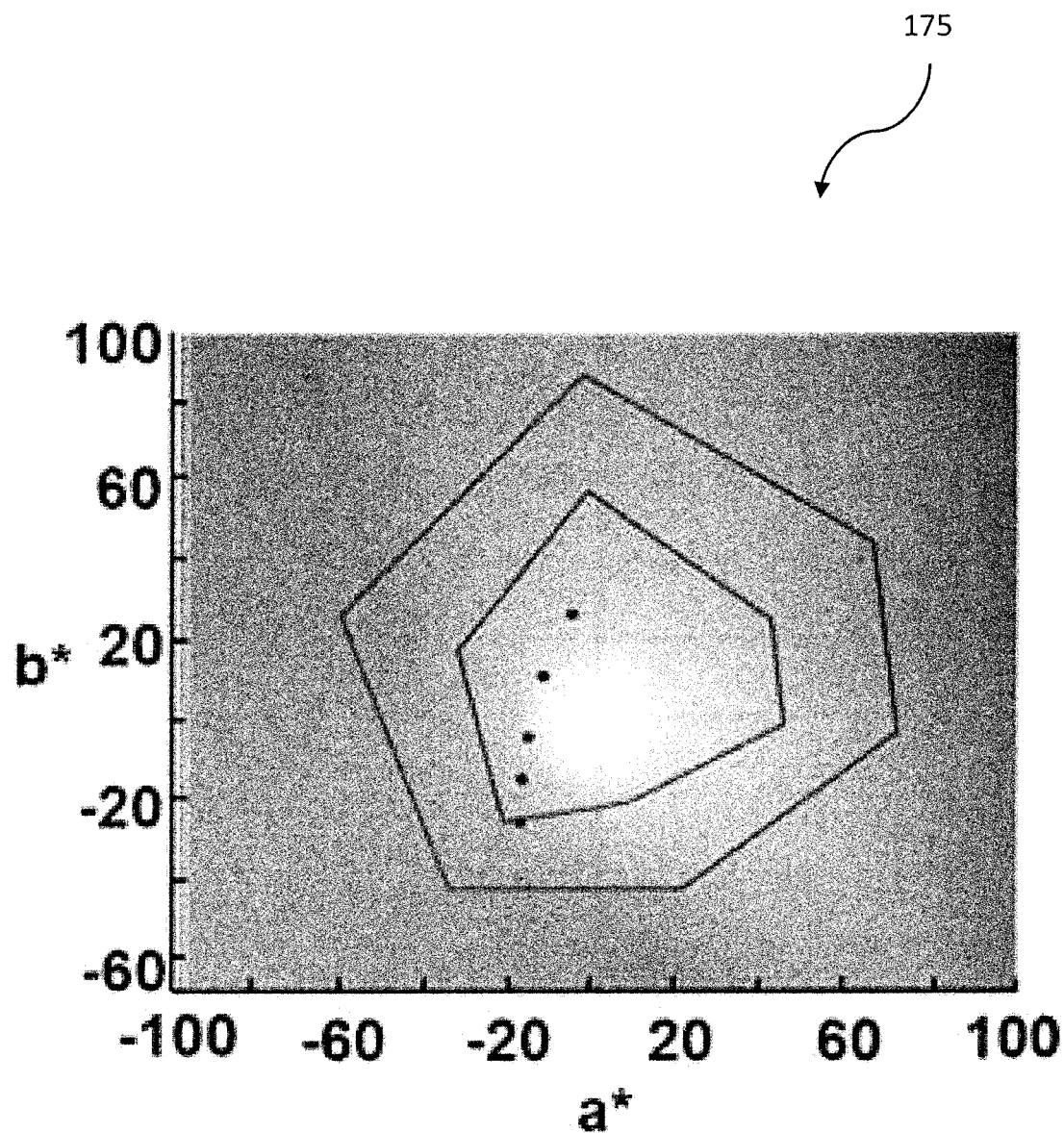
FIG. 7B is a diagram of corresponding points within CIE Lab space, according to the present invention.
Figure 8:
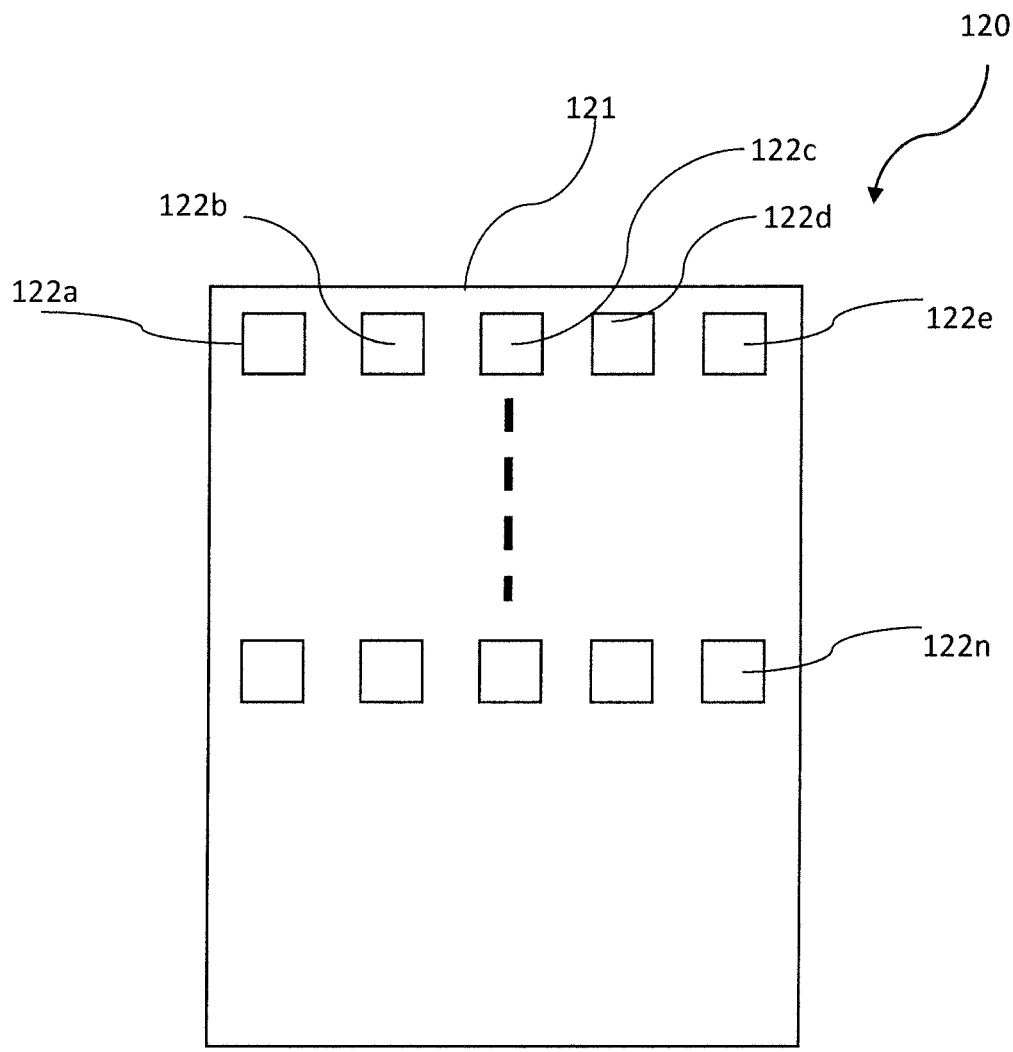
FIG. 8 is a schematic diagram of an inorganic paint pigment, according to the present invention.

Another approach to widen the color space of the plasmonic surface is the addition of multiple layers of aluminum particles and oxides. By doing this, colors outside the CYM space can be obtained. To demonstrate this, the process begins with the aluminum mirror and 10 nm of aluminum oxide, as illustrated in FIG. 8C. A magenta is formed through the deposition of 7 nm of aluminum nanoparticles and shifted to cyan through the ALD of a second aluminum oxide film. After a final deposition of 5 nm of aluminum nanoparticles, the surface exhibits a range of colors shown in a diagram 174 of FIG. 7A. In this case, it shows creation of green colors. The thickness of this second oxide film greatly influences the combined resonances of the surface and the CIE Lab coordinates of these samples are shown in a diagram 175 of FIG. 7B. It can be seen that by combining particle layers of cyan and yellow, a route to green exists. Further thickness optimizations and modification to the particle distributions can improve the quality of this green.

Plasmonic Paint

Figure 9A:
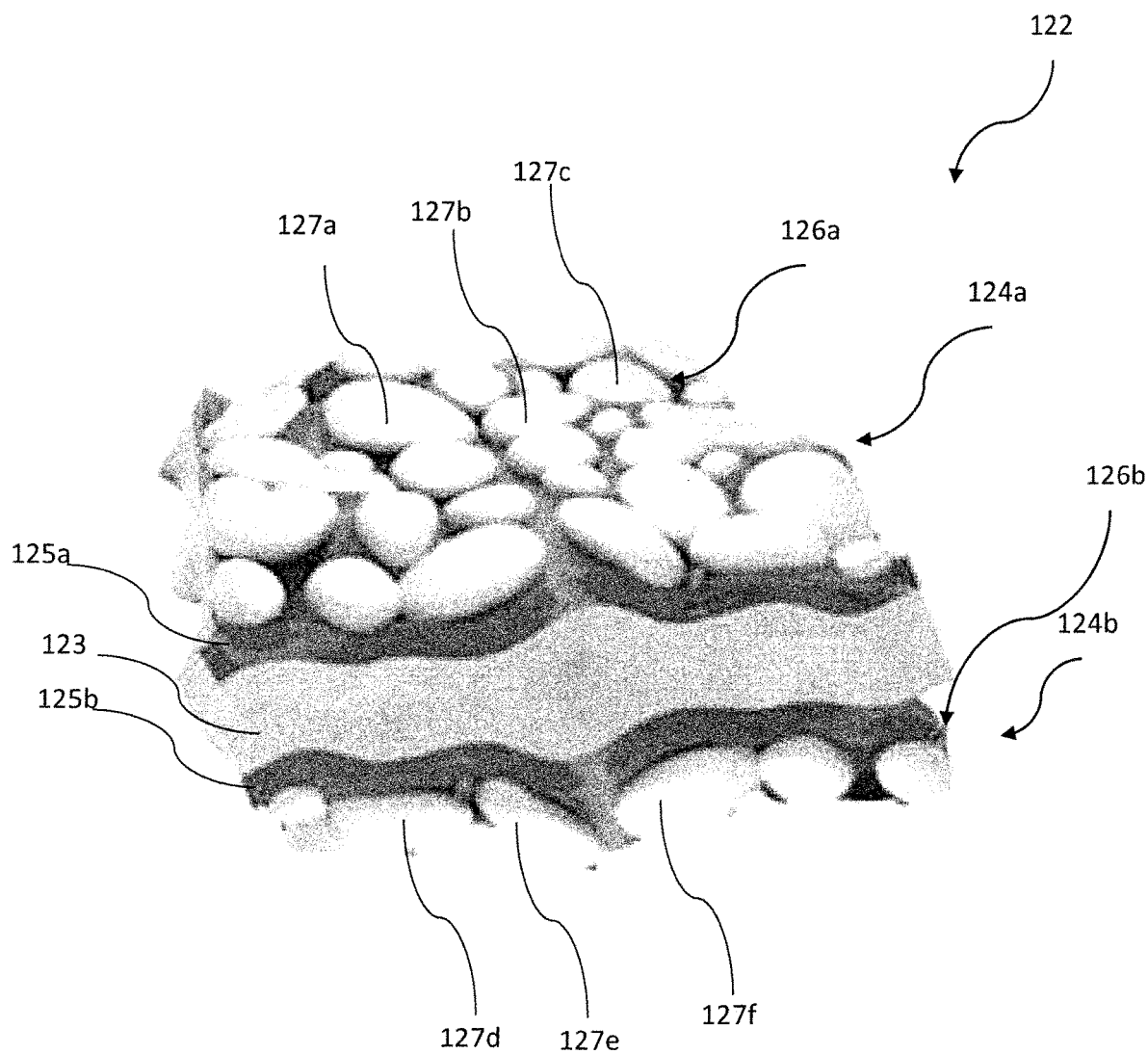
FIG. 9A is a schematic perspective view of a paint flake comprising symmetric layers of oxide and particle about a central aluminum mirror, according to the present invention.
Figure 9B:
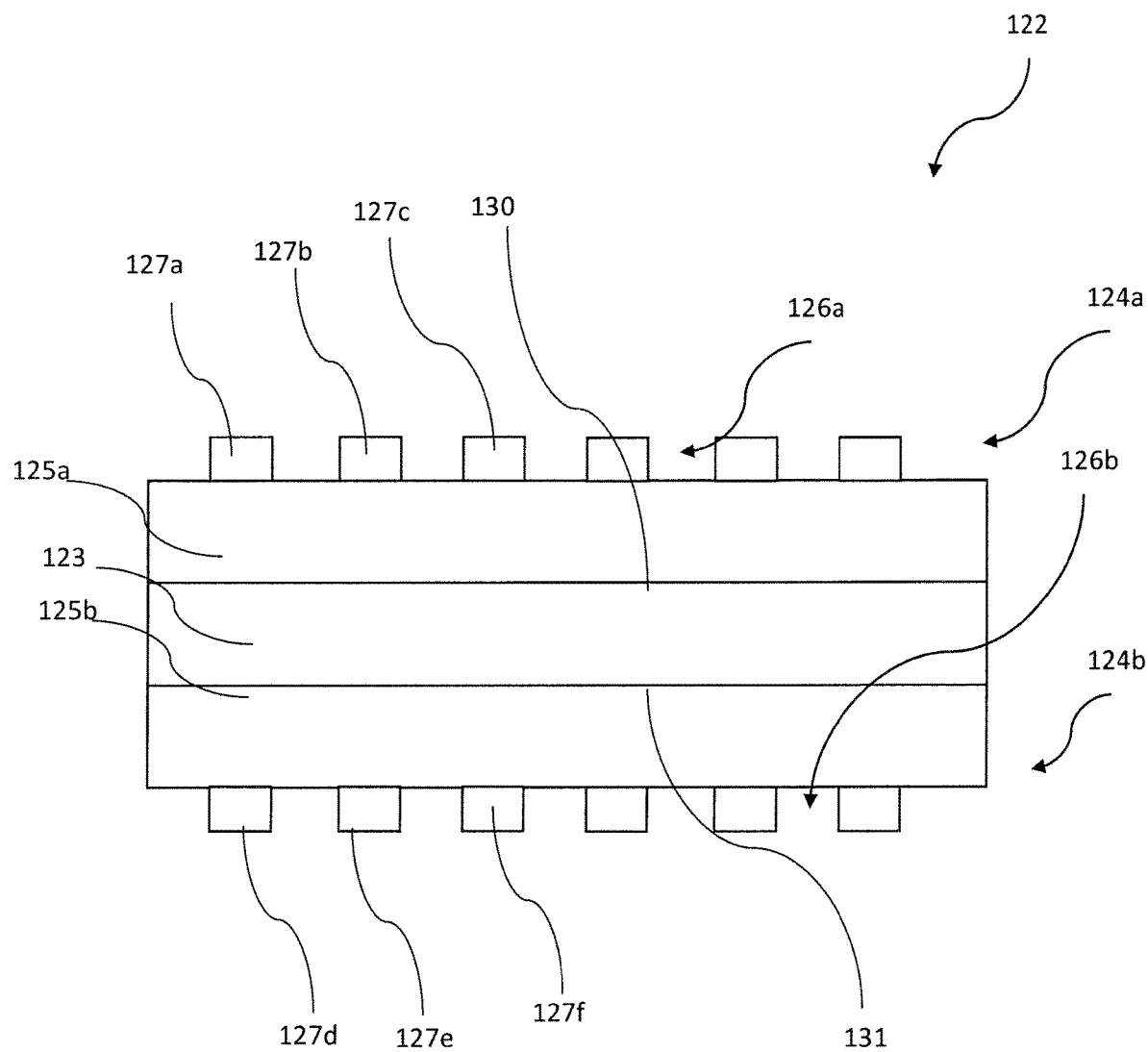
FIG. 9B is a schematic diagram of a paint flake, according to the present invention.
Figure 10A:
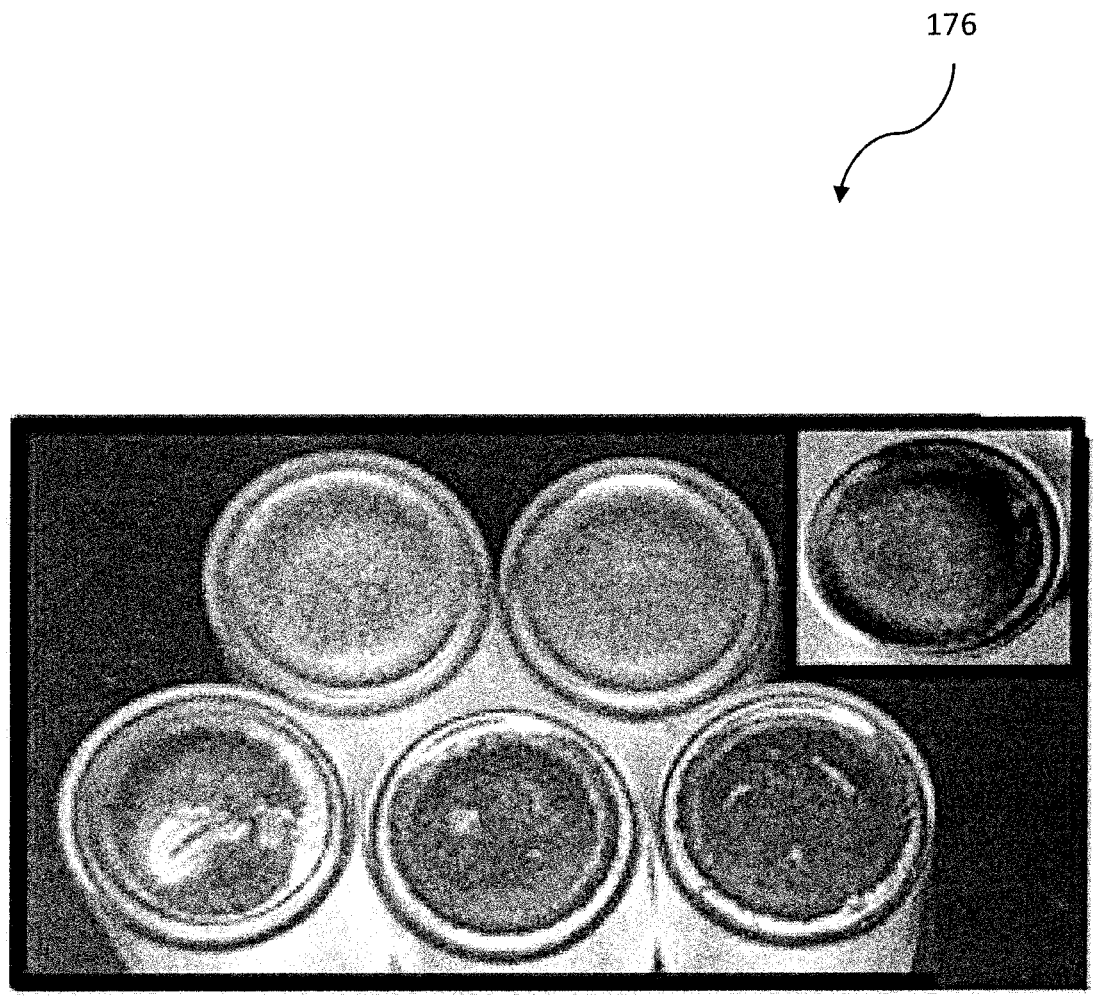
FIG. 10A is an image of the paint flakes lining a bottom of a container after being released from a sacrificial layer, according to the present invention.
Figure 10B:
FIG. 10B is an image of paint flakes dispersed in isopropyl alcohol (IPA) resulting in a simmering colored metallic effect, according to the present invention.

The present disclosure includes another application of the self-assembled plasmonic surface in the form of inorganic pigments. By forming the structure on a sacrificial polymer layer, the metal film can be released with sonication into an aqueous or similar solution to form suspended flakes. To guarantee that color is seen from the flakes regardless of orientation, the nanoparticle system is assembled on both surfaces surrounding the aluminum mirror. FIG. 9A shows an illustration of representative paint flake. If left to settle in the solution, as shown in an image 176 of FIG. 10A, the flakes line the bottom of the container and give an approximation of the final colors one might obtain if assembled with a binder and used to coat an object. FIG. 10B shows an image 177 of the large range of colored flakes suspended in IPA.

In conclusion, the present disclosure has demonstrated a large area, highly reproducible self-assembling technique where aluminum particles are formed on a surface through a temperature and pressure dependent thin film growth mechanism in an ultra-high vacuum electron beam evaporator. This process is compatible with and takes on the scattering properties of underlying substrates and can result in completely diffusive, angle-independent and flexible plasmonic color surfaces. The present disclosure then demonstrates the potential and novelty of such a color generation mechanism by exploring its active tuning and integration with optoelectronic devices. The present disclosure then explores the expansion of the color space to obtain green as well as the application of the structures to plasmonic paint, providing a platform of inorganic pigments.

Fabrication of the Self-Assembled Plasmonic System

The 150 nm Al mirrors are deposited on glass using a Thermionics electron beam evaporation system. Deposition is performed at ~5×10$^{-6}$ T at a rate of ~0.1 nm s$^{-1}$ and room temperature. The aluminum oxide layer is deposited by atomic layer deposition (Savannah 2, Cambridge Nanotech) at 100° C. using pulses of trimethylaluminum and water. The aluminum particles are then evaporated in an electron beam evaporator at ~5×10$^{-8}$ T, 100° C. and ~0.05 nm s$^{-1}$, as available from AJA International, Inc. of Scituate, Mass.

Finite Difference Time Domain Modeling

Reflection spectra are calculated using experimental parameters with commercial FDTD software package (Lumerical FDTD, Lumerical Solutions Inc.). The wavelength dependent refractive index of aluminum is taken from Palik and the anisotropic parameters of the liquid crystal (LC) layer are obtained using an effective anisotropic index model based on the orientation of LC obtained from finite element method (FEM) calculations.

Referring to FIG. 9A, an inorganic paint pigment according to the present disclosure is now described. The inorganic paint pigment illustratively includes an aqueous solution, and a plurality of paint chips within the aqueous solution.

Each paint flake illustratively includes a first major surface and a second major surface opposing the first major surface, each the first and second major surfaces comprising an aluminum reflector layer. The aluminum reflector layer illustratively includes an aluminum mirror layer, an aluminum oxide layer over the aluminum mirror layer, and a plurality of self-assembled aluminum particles the aluminum oxide layer.

Another aspect is directed to a method for making an inorganic paint pigment comprising forming a plurality of paint flakes on a sacrificial polymer layer. Each paint flake may include a first major surface and a second major surface opposing the first major surface, both the first and second major surfaces comprising an aluminum reflector layer. The method may also comprise applying a sonication process to remove the plurality of paint flakes, and combining the plurality of paint flakes into an aqueous or similar solution.

Referring now to FIGS. 8-10B, an inorganic paint pigment 120 according to an exemplary embodiment of the present disclosure is now described. It should be appreciated that one or a combination thereof of the features described hereinabove can be applied to the inorganic paint pigment 120. Moreover, the teachings of the article, authored by the present application's inventors, Franklin, D. et al., "Self-Assembled Plasmonics for Angle Independent Color Displays with Actively Addressed Black States", can also be applied to the present embodiments, the contents of this article are hereby incorporated by reference in their entirety. A copy of this article is submitted within an Information Disclosure Statement accompanying this application.

The inorganic paint pigment 120 illustratively comprises a fluid matrix 121, and a plurality of paint flakes 122a-122n carried within the fluid matrix. The fluid matrix 121 may comprise at least one of a solution and a polymer resin. The fluid matrix 121 may comprise a binder fluid, thereby enabling effective coating of objects. The fluid matrix 121 may comprise IPA in some embodiments.

Each paint flake 122a-122n illustratively includes a common aluminum layer 123 having a first major surface 130 and a second major surface 131 opposing the first major surface. In some embodiments, the common aluminum layer 123 may comprise an aluminum mirror layer. Each paint flake 122a-122n illustratively includes a first plasmonic aluminum reflector layer 124a carried by the first major surface 130, and a second plasmonic aluminum 124b reflector layer carried by the second major surface 131. Each paint flake 122a-122n may be symmetric about the common aluminum layer 123.

In the illustrated embodiment of FIG. 9A, each of the first plasmonic aluminum reflector layer 124a and the second plasmonic aluminum reflector layer 124b comprises an oxide layer 125a-125b respectively on the first major surface 130 and the second major surface 131 of the common aluminum layer 123, and a layer of self-assembled aluminum particles 126a-126b over the respective oxide layer. For example, the oxide layer 125a-125b may comprise an aluminum oxide layer. Plasmon resonance within each of the first plasmonic aluminum reflector layer 124a and the second plasmonic aluminum reflector layer 124b may be independent to an angle of incidence for incident visible radiation.

Figure 11:
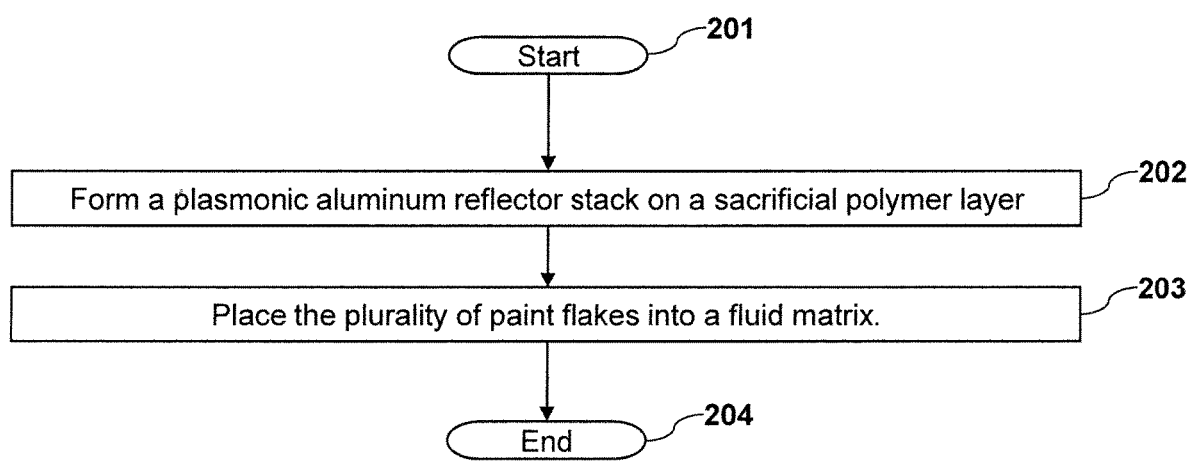
FIG. 11 is a flowchart for a method for making the inorganic paint pigment of FIG. 8.

Referring now to FIG. 11, a method for making the inorganic paint pigment 120 is described using a flowchart 200, which begins at Block 201. The method comprises forming a plasmonic aluminum reflector stack on a sacrificial polymer layer, and dissolving the sacrificial polymer layer and generating a plurality of paint flakes 122a-122n from the plasmonic aluminum reflector stack. (Block 202). In some embodiments, the dissolving and generating steps may comprise a sonication process.

Each paint flake 122a-122n includes a common aluminum layer 123 having a first major surface 130 and a second major surface 131 opposing the first major surface, a first plasmonic aluminum reflector layer 124a carried by the first major surface, and a second plasmonic aluminum reflector layer 124b carried by the second major surface. The method also includes placing the plurality of paint flakes 122a-122n into a fluid matrix 121. (Blocks 203-204).

Referring now again to FIG. 1, an embodiment of the plasmonic aluminum reflector layer 302 is now described. In this embodiment of the plasmonic aluminum reflector layer 302, the plasmonic aluminum reflector layer 302 illustratively includes an aluminum backplane substrate 303, an aluminum oxide layer 304 over the aluminum backplane substrate, and a layer of self-assembled aluminum particles 305 over the aluminum oxide layer. The layer of self-assembled aluminum particles 305 illustratively comprises nanoparticles 308a-308b of varying size and shape. In this illustration, a portion (i.e. a spectral portion) of the incident visible radiation 313a is reflected at the plasmonic aluminum reflector layer 302 and emitted as reflected visible radiation 313b. The other portion (noted with circles) of the incident visible radiation 313a is absorbed.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An inorganic paint pigment comprising:
a fluid matrix; and
a plurality of paint flakes carried within the fluid matrix; each paint flake comprising
a common aluminum layer having a first major surface and a second major surface opposing the first major surface,
a first plasmonic aluminum reflector layer carried by the first major surface, and
a second plasmonic aluminum reflector layer carried by the second major surface;
each of the first plasmonic aluminum reflector layer and the second plasmonic aluminum reflector layer comprising
an oxide layer over the common aluminum layer, and
a layer of self-assembled aluminum particles over the oxide layer and having hybridized individual plasmonic modes to provide angle independent color, a gap between the common aluminum layer and the layer of self-assembled aluminum particles being less than 10 nm.

2. The inorganic paint pigment of claim 1 wherein the common aluminum layer comprises an aluminum mirror layer.

3. The inorganic paint pigment of claim 1 wherein the oxide layer comprises an aluminum oxide layer.

4. The inorganic paint pigment of claim 1 wherein plasmon resonance within each of the first plasmonic aluminum reflector layer and the second plasmonic aluminum reflector layer is independent to an angle of incidence for incident visible radiation.

5. The inorganic paint pigment of claim 1 wherein the fluid matrix comprises at least one of a solution and a polymer resin.

6. The inorganic paint pigment of claim 1 wherein the fluid matrix comprises a binder fluid.

7. The inorganic paint pigment of claim 1 wherein the fluid matrix comprises isopropyl alcohol (IPA).

8. The inorganic paint pigment of claim 1 wherein each paint flake is symmetric about the common aluminum layer.

9. An inorganic paint pigment comprising:
a fluid matrix; and
a plurality of paint flakes carried within the fluid matrix; each paint flake comprising
a common aluminum mirror layer having a first major surface and a second major surface opposing the first major surface,
a first plasmonic aluminum reflector layer carried by the first major surface, and
a second plasmonic aluminum reflector layer carried by the second major surface,
each of the first plasmonic aluminum reflector layer and the second plasmonic aluminum reflector layer comprising
an oxide layer over the common aluminum mirror layer, and
a layer of self-assembled aluminum particles over the oxide layer and having hybridized individual plasmonic modes to provide angle independent color, a gap between the common aluminum mirror layer and the layer of self-assembled aluminum particles being less than 10 nm, a wavelength of the angle independent color being based upon a diameter of the self-assembled aluminum particles.

10. The inorganic paint pigment of claim 9 wherein the oxide layer comprises an aluminum oxide layer.

11. The inorganic paint pigment of claim 9 wherein plasmon resonance within each of the first plasmonic aluminum reflector layer and the second plasmonic aluminum reflector layer is independent to an angle of incidence for incident visible radiation.

12. The inorganic paint pigment of claim 9 wherein the fluid matrix comprises at least one of a solution and a polymer resin.

13. The inorganic paint pigment of claim 9 wherein the fluid matrix comprises a binder fluid.

14. The inorganic paint pigment of claim 9 wherein the fluid matrix comprises isopropyl alcohol (IPA).

15. The inorganic paint pigment of claim 9 wherein each paint flake is symmetric about the common aluminum mirror layer.

16. A method for making an inorganic paint pigment comprising:

forming a plasmonic aluminum reflector stack on a sacrificial polymer layer; and releasing the plasmonic aluminum reflector stack via a sonication step into a solvent and generating a plurality of paint flakes from the plasmonic aluminum reflector stack, each paint flake comprising a common aluminum layer having a first major surface and a second major surface opposing the first major surface, a first plasmonic aluminum reflector layer carried by the first major surface, and a second plasmonic aluminum reflector layer carried by the second major surface.

17. The method of claim 16 wherein the common aluminum layer comprises an aluminum mirror layer.

18. The method of claim 16 wherein each of the first plasmonic aluminum reflector layer and the second plasmonic aluminum reflector layer comprises an oxide layer over the common aluminum layer, and a layer of self-assembled aluminum particles over the oxide layer.

19. The method of claim 18 wherein the oxide layer comprises an aluminum oxide layer.

20. The method of claim 18 wherein plasmon resonance within each of the first plasmonic aluminum reflector layer and the second plasmonic aluminum reflector layer is independent to an angle of incidence for incident visible radiation.

21. The method of claim 16 wherein each paint flake is symmetric about the common aluminum layer.

22. The inorganic paint pigment of claim 1 wherein a wavelength of the angle independent color is based upon a diameter of the self-assembled aluminum particles.

* * * * *